US 8,012,379 B2

(12) United States Patent
Miyakawa et al.

(10) Patent No.: US 8,012,379 B2
(45) Date of Patent: Sep. 6, 2011

(54) ELECTROCONDUCTIVE BONDING MATERIAL AND ELECTRIC/ELECTRONIC DEVICE USING THE SAME

(75) Inventors: Hidenori Miyakawa, Osaka (JP); Shigeaki Sakatani, Osaka (JP); Kumiko Sugiyama, Kanagawa (JP); Takayuki Higuchi, Osaka (JP); Atsushi Yamaguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/870,275

(22) Filed: Aug. 27, 2010

(65) Prior Publication Data

US 2010/0316794 A1    Dec. 16, 2010

Related U.S. Application Data

(62) Division of application No. 11/886,722, filed as application No. PCT/JP2006/305708 on Mar. 22, 2006, now abandoned.

(30) Foreign Application Priority Data

Mar. 23, 2005    (JP) ................................ 2005-082925

(51) Int. Cl.
    *H01B 1/02*    (2006.01)
    *B05D 7/00*    (2006.01)
(52) U.S. Cl. ....................................... 252/514; 427/216
(58) Field of Classification Search ....... 252/500–521.6, 252/514; 427/216
See application file for complete search history.

(56) References Cited

U.S. PATENT DOCUMENTS

| 2004/0004209 A1* | 1/2004 | Matsuba et al. ........... 252/518.1 |
| 2004/0082189 A1* | 4/2004 | Totokawa ...................... 438/720 |
| 2005/0194577 A1* | 9/2005 | Kasuga et al. ................ 252/514 |
| 2006/0038304 A1* | 2/2006 | Osako et al. .................. 257/789 |

FOREIGN PATENT DOCUMENTS

| CN | 1267317 | 9/2000 |
| EP | 0 594 133 | 4/1994 |
| EP | 1 291 390 | 3/2003 |
| JP | 1-98674 | 4/1989 |

(Continued)

OTHER PUBLICATIONS

International Search Report (in the English language) of Jun. 20, 2006 issued in International Application No. PCT/JP2006/305708.

(Continued)

*Primary Examiner* — Mark Kopec
*Assistant Examiner* — Jaison Thomas
(74) *Attorney, Agent, or Firm* — Wenderoth, Lind & Ponack, L.L.P.

(57) ABSTRACT

A conductive bonding material having an improved preservation stability, and hardens when desired, preferably immediately hardens at a low temperature is provided. In one invention, the conductive bonding material comprises a conductive particle ingredient, an epoxy resin ingredient, and a hardening agent ingredient for said epoxy resin and the hardening agent ingredient for said epoxy resin further comprise a reforming agent having a thiol group. In another invention, a conductive bonding material comprising an epoxy resin hardening ingredient, wherein said epoxy resin hardening ingredient contains a sulfur-containing compound having an end group which can coordinate with a surface of the metallic particles, and the sulfur-containing compound comes to perform as a hardening agent for the epoxy resin by dissociating from the surface of the metallic particles. The conductive bonding material may contain fragrance.

19 Claims, 6 Drawing Sheets

FOREIGN PATENT DOCUMENTS

| | | |
|---|---|---|
| JP | 4-23882 | 4/1992 |
| JP | 5-274911 | 10/1993 |
| JP | H05-274911 * | 10/1993 |
| JP | 6-211969 | 8/1994 |
| JP | 8-111346 | 4/1996 |
| JP | 10-60097 | 3/1998 |
| JP | 10-298526 | 11/1998 |
| JP | 11-12346 | 1/1999 |
| JP | 11-106731 | 4/1999 |
| JP | 11-130841 | 5/1999 |
| JP | 11-199842 | 7/1999 |
| JP | 2000-230112 | 8/2000 |
| JP | 2001-49219 | 2/2001 |
| JP | 2001-354942 | 12/2001 |
| JP | 2002-284860 | 10/2002 |
| JP | 2002-299833 | 10/2002 |
| JP | 2002-329945 | 11/2002 |
| JP | 2003-64330 | 3/2003 |
| JP | 2003-183609 | 7/2003 |
| JP | 2004-189954 | 7/2004 |
| JP | 2004-277444 | 10/2004 |
| WO | 99/09101 | 2/1999 |

OTHER PUBLICATIONS

International Preliminary Report on Patentability issued Oct. 4, 2007 in the International (PCT) Application No. PCT/JP2006/305708.

* cited by examiner (a)

(b)

(c)

(a)

(b)

(c)

(d)

(a)

(b)

(c)

(d)

(a)

(b)

(c)

(d)

(e)

(a)

(b)

(c)

(d)

(a)

(b)

(c)

(d)

(e)

ELECTROCONDUCTIVE BONDING MATERIAL AND ELECTRIC/ELECTRONIC DEVICE USING THE SAME

This application is a divisional application of U.S. application Ser. No. 11/886,722, now abandoned, filed Mar. 3, 2008, which was the national phase filing of International Patent Application No. PCT/JP2006/305708, filed Mar. 22, 2006.

BACKGROUND OF THE INVENTION

1. Field of the Invention

The present invention relates to an electroconductive (hereinafter, also referred to as "conductive") bonding material comprising an electroconductive particles ingredient, an epoxy resin ingredient and an epoxy resin-hardening ingredient, a method for producing an electric/electronic circuit, as well as an electric/electronic device having such an electric/electronic circuit.

2. Description of Related Art

In the field of producing electric/electronic circuits, an electroconductive bonding material, i.e. an electroconductive adhesive is widely used for the purposes of mounting electric/electronic components (hereinafter, also collectively referred to as "electric components") onto a circuit board and the purposes of forming conductor pattern on a circuit board. The electroconductive adhesives, which are used in the field of mounting the electric components, basically having a composition comprising a resin composition as a binder and conductive particles of such as metallic particles which are dispersed in the resin composition. The conductive adhesives, wherein the resin composition has a paste-like form, are referred to as the conductive paste.

Such resin composition contains a resin-hardening ingredient, which makes the resin composition harden by being subjected to a condition, e.g. by being subjected to a predetermined temperature condition. When a conductive adhesive is subjected to a predetermined temperature condition, the resin composition therein volumetrically shrinks while hardening, so that the volume of the resin composition as a whole decreases. As a result, the conductive particles which were dispersed in the resin composition come to contact one another and form a continuous conductive path through the hardened conductive adhesive.

As an example of such conductive adhesives, there is an epoxy-based conductive adhesive composition which contains an epoxy resin as the resin composition, a hardening agent for hardening the epoxy resin, and metallic particles such as silver or nickel as the conductive ingredient. The conductive adhesive compositions of such type hardens generally by being heated to a temperature of 120 degree centigrade or more.

Recently, electric components having lower heat resistance property are frequently used in connection with the advancement of the functions of electric components. Accordingly, a conductive adhesive (i.e. a bonding material for mounting) which hardens at a lower temperature is highly required. Further, considering the operability at work sites, preservation stability for a period from several days to several weeks in the adhesive component state is also required for a one-component adhesive composition as mentioned in the above.

Intending to prepare a conductive adhesive paste having lower hardening temperature, applying one-component type epoxy resin composition having a low hardening temperature, which has been known as an adhesive material, to a conductive paste is examined. For example, a resin composition containing an epoxy resin, a thiol compound as the hardening agent and a latent hardening promotor of solid dispersed type is known as an adhesive (Patent Document 1). Furthermore, aiming to improve preservation stability, a conductive paste containing a borate ester compound in addition to the above composition is proposed (Patent Document 2).

[Patent Document 1] Japanese Patent Kokai Publication No. 211969/1994
[Patent Document 2] Japanese Patent Kokai Publication No. 2000-230112

DISCLOSURE OF THE INVENTION

Problem to be Solved by the Invention

Based on the technical background as mentioned above, one object of the present invention of the present application is to provide a conductive adhesive for mounting electric components, which can be hardened at a relatively low temperature and has an improved preservation stability. Another objects of the present invention is to provide a method of preparing circuit boards using the present conductive adhesive for mounting and to provide electric/electronic components being equipped with such circuit boards.

Another object of the present invention of the present application is to provide a conductive paste which can be hardened at a desired condition, preferably can be quickly hardened at a relatively low temperature and has an improved preservation stability without an additional component such as borate ester compound. Another object of the present invention is to provide a method of producing circuit boards and electric components mounted products (or body) using such a conductive paste.

It is not preferable to use compounds having a thiol group (—SH) as a hardening agent of the epoxy resin in view of health and safety, since an operator handling the compounds feel uncomfortable with the particular unpleasant stench which is inherent in the thiol group and which is emanated from the compounds at the work site. In addition, it is not easy to visually identify or optically determine the end of the hardening reaction based on the change of color tone since, on the one hand, unhardened epoxy resin is generally transparent and changes its color tone when hardened, and on the other hand, the conductive fillers (i.e. conductive particles) contained in the conductive paste are generally opaque.

Thus, another object of the present invention is to provide a conductive paste, which can prevent or reduce emanating unpleasant stench and allow the operator to identify the end of the hardening reaction more easily relating to an epoxy-based conductive adhesive. A further object of the present invention is to provide a method of producing circuit boards and electric components mounted products using such a conductive paste.

Means for Solving the Problems

The present application provides an invention of a conductive bonding material comprising a conductive particle ingredient, an epoxy resin ingredient, and an epoxy resin-hardening agent, wherein the epoxy resin-hardening agent further contains linear or cyclic sulfur-containing compound. It is preferable that such sulfur-containing compound is a compound that has a thiol group (—SH).

According to one aspect, the first invention in the present application provides a bonding material for mounting (or a conductive adhesive) comprising an epoxy resin, a latent hardening promotor for hardening the epoxy resin and conductive particles, wherein the bonding material further contains sulfur-containing compounds at a ratio of about 1 to 100 parts by weight on the basis of 100 parts by weight of the epoxy resin.

Since the sulfur-containing compound has a SH-group therein, the "—S—" moiety in the compound inherent in the SH-group attacks the C+ (carbocation) in the epoxy group through a nucleophilic substitution reaction to open the epoxy ring, thereby the hardening reaction starts, according to the bonding material for mounting of the first invention.

Contrary to it, the other reforming agent, for example the reforming agent of a silane-based, a titanate-based and an aluminate-based coupling agent (or surface treatment agent) can not start the hardening reaction. When such coupling agent is added to the conductive adhesive containing an epoxy resin and a latent hardening promotor and having a standard hardening condition of about 10 minutes at a temperature of 120 degree centigrade, on the one hand, adhesion strength could be somewhat improved, and on the other hand, hardening property would be rarely influenced, or rather higher hardening temperature would be required, for example a hardening condition of heating at a temperature of 130 degree centigrade for about 10 minutes would be required.

According to the bonding material for mounting of the first invention, the epoxy resin-hardening ingredient is activated and the epoxy resin ingredient can be hardened by being heated at a relatively low temperature, for example at a temperature from about 70 degree centigrade to 110 degree centigrade for about 10 minutes since the bonding material contains a sulfur-containing compound at an adequate amount. Therefore, when the bonding material for mounting of the present invention would be used, electric components can be mounted on a circuit board with avoiding thermal damage and without the necessity of particular treatment and/or apparatus, even when the electric components had an allowable temperature limit of 120 degree centigrade or lower. Further, the bonding material for mounting of the present invention has an advantage that it has an improved preservation stability and it is suitable for producing circuit boards successively (or at the same conditions).

The amount of the sulfur-containing compound is about 1 to 100 parts by weight based on 100 parts by weight of the epoxy resin. On the one hand, sufficient decreasement of the hardening temperature is not attained when the amount of the reforming agent is less than about 1 part by weight, and on the other hand, sufficient preservation stability is not attained when the amount of the reforming agent is more than about 100 parts by weight.

In one embodiment, the bonding material for mounting of the first invention further contains a thickening agent. It becomes to be possible to suitably supply the present bonding material for mounting to desired regions on the circuit board depending on the methods such as transfer printing, screen printing, dispensing by adjusting the viscosity of the present bonding material for mounting by adding a thickening agent.

Another aspect of the present first invention also provides an electric/electronic device containing one or more circuit boards, which boards one or more electric components were mounted on using the present bonding material of the first invention.

Those circuit boards can be prepared by a method comprising the steps:
supplying the bonding material of the first invention to predetermined regions (typically, electrodes or land areas) on the boards;
arranging electric components, on the boards by contacting the electric components (in particular, the electrodes of the electric components) with the bonding material;
heating the bonding material at a temperature of 70 to 110 degree centigrade to harden the epoxy resin; and
thereby the electric components are mechanically and electronically bonded (i.e. mounted) to the electrodes on the circuit board, wherein the above steps are carried out in the above sequence.

The present application provides, as a second invention, a conductive bonding material as recited in claim 1 characterized in that the conductive particles ingredient are metallic particles and the sulfur-containing compounds are co-ordinated with the surface of the metallic particles, and that the sulfur-containing compounds (thiol-compounds) remove (or dissociate) from the metallic particles to change to the epoxy resin-hardening agent by being subjected to a predetermined condition.

The present second invention, in one embodiment, is characterized in that the conductive particles comprise metallic particles selected from the group consisting of gold, silver and copper.

The present second invention, in another embodiment, is characterized in that subjecting to a predetermined condition is to subject to any of ultraviolet ray irradiation, electron ray irradiation and heating operation. According to any of these operation, the epoxy resin-hardening ingredient can be activated.

The present second invention, in another embodiment, is characterized in that the metallic particles have a mean particle diameter ranging from 1 nm to 100 micrometer.

The present second invention, in another embodiment, is characterized in that the metallic particles have a mean particle diameter ranging from 1 nm to 100 nm.

As the conductive paste for circuit preparing application or connecting circuit layers application, it is known that metallic particles in nano-size (i.e. the dimension in the order of nanometer (nm)) (hereinafter, also referred to as "metallic nano-particles") are dispersed in a liquid medium. Since the metallic nano-particles have higher activity rather than metallic particles having larger diameter or dimension and easily agglomerate together at normal temperature, they have a problem relating to the preservation stability. In order to dissolve the problem, a method comprising adding dispersing agent to the metallic nano-particles, which dispersing agent can form coordinate bond with the metallic nano-particles, thereby the metallic nano-particles being protected and stabilized, and then eliminating the dispersing agent from the metallic nano-particles by heating and trapping them by acid-anhydrides (for example, see the Japanese Patent Kokai Publication 2002-299833).

The inventors have completed the present invention as a result of extensive and intensive efforts, while paying attention to the matter that the coordinating state of the sulfur-containing compounds to the metallic particles can be controlled by use of the sulfur-containing compounds.

In accordance with the first aspect of the second invention, there is provided a conductive paste comprising metallic particles, a sulfur-containing compound and a resin characterized in that the sulfur-containing compound coordinates at the end group thereof with the surface of the metallic particles, and then the end group performs as the hardening agent for the resin component after being dissociated from the surface of the metallic particles.

According to the conductive paste as mentioned in the above, the sulfur-containing compound can coordinate at the end group thereof with the surface of the metallic particles (hereinafter, those sulfur-containing compound are also referred to as "coordinatable sulfur-containing compound" in the present specification), do not perform as the hardening agent for the resin component in the coordinating state and performs as the hardening agent for the resin component in the state that it dissociated from the surface of the metallic particles. In short, the coordinated sulfur-containing compound is one kind of latent hardening agent. The hardening reaction of the latent hardening agent can be inhibited by capping the end group thereof through the coordinated bond, which group can cause hardening reaction. When the end group is freed by breaking the bond, the agent can cause the hardening reaction. These conductive paste can show high preservation stability while the sulfur-containing compound keeps coordinating state, and start hardening reaction by dissociating the coordinated bond when desired. In particular, when a sulfur-containing coordinatable compound having a function as a hardening agent at a low temperature in a dissociated state is used, the paste can show an improved preservation stability and can immediately harden at a low temperature when desired.

In the context of the present invention, the recitation "performs as the hardening agent" means that it causes hardening reaction of the resin components, for example, by facilitating the bonding reaction among the resin components or by forming cross-link among the resin components through bonding with the resin components.

It is necessary for the end group of the coordinatable sulfur-containing compound that it can form a coordinated state with the metallic particles in a normal state and break the coordinated state when desired. Such end group may be those containing one or more of coordinated atoms having lone-pair electrons. The coordinated bond among the metallic particles and the coordinated atoms can be broken by external influences, such as irradiation of ultraviolet ray or electron ray or by being heated. The exposure dose of ultraviolet ray or electron ray and the temperature and period of heating may be optionally selected. In addition, it is further necessary that the end group of the coordinatable sulfur-containing compound contributes to the hardening reaction of the resin and performs as a hardening agent, while the degree of such properties may vary depending on the combination of the resin to be used and hardening method. The coordinatable sulfur-containing compound may immediately perform as a hardening agent in its dissociated state, or alternatively, may perform as a hardening agent by being subjected to any external influences, such as by being heated.

The end group of the coordinatable sulfur-containing compound may be, for example a thiol group. The thiol group can coordinate with a metal due to having a sulfur atom having lone-pair electrons and contributes to the hardening of resins, in particular the fast hardening of epoxy resins at a low temperature. The examples of such coordinatable sulfur-containing compounds are, for example, alkane thiol compounds, in particular monothiol compounds such as 1-decanethiol and 1-hexanethiol, polythiol compounds such as 1,10-decanedithiol, 1,8-octadithiol and 1,6-hexanedithiol and the other mono- or poly-thiol compounds which have one or more thiol end group. In general, the hardening period of polythiol compounds is rather shorter than that of monothiol compounds.

As the epoxy resins, un-hardened epoxy resin, that is, a resinous material having two or more epoxy groups in one molecule may be used. For example, epoxy resins which are known in the prior art, such as glycidyl ether type epoxy resins, glycidyl ester type epoxy resins, glycidyl amine type epoxy resins and cyclic aliphatic type epoxy resins may be used. Alternatively, precursors of such compounds may also be used.

The present second invention is not limited to the above matters and can use optionally suitable materials as the coordinatable sulfur-containing compound and resins without departing from the concept of the invention. For example, the end group of the coordinatable sulfur-containing compound may be an amino group.

The metallic particles may be those comprising metallic materials selected from the group of gold, silver and copper. Although it is not intended to limit the present invention, the sulfur atom in the thiol group as mentioned in the above can suitably coordinate with the surface of the metallic particles comprising such metallic materials, on the other hand, it substantially not coordinate with the surface of the metallic particles comprising for example nickel particles.

In one embodiment of the second invention, the metallic particles have a mean diameter for example between about 1 nm and 100 micrometer, preferably between about 1 nm and 100 nm. A conductive paste using metallic particles having a mean diameter between about 1 nm and 100 micrometer exhibits favorable printing property when applied to printing methods and attains sufficiently low resistivity as a conductive material after the resin hardened. A conductive paste using nano-sized metallic particles having a mean diameter between about 1 nm and 100 nm may cause metallic particles to sinter at a relatively low temperature, so that particularly lower resistivity can be stably achieved relative to the volumetric change of the hardening resin due to temperature variation. When the conductive paste is preserved, metallic nano-particles are protected and stabilized by the presence of the coordinatable sulfur-containing compound, so that adequate dispersibility and preservation stability can be attained without causing the problem relating to the agglomeration of metallic nano-particles.

In one embodiment of the second invention, the conductive paste can contain two or more kinds of metallic particles and the coordinatable sulfur-containing compound can coordinate at the end group thereof with the surface of at least one kind of metallic particles. These metallic particles may have different mean diameters. For example, it is preferable that the conductive paste contains the nano-sized metallic particles and the other metallic particles having larger diameters. When the combination of the metallic particles having different mean diameters is used, the filling density of the metallic particles is improved, while the printing property is also improved rather than using merely nano-sized metallic particles. Further, use of such combination of the metallic particles can decrease the material cost by decreasing the relative amount of the expensive nano-sized metallic particles in the metallic particle ingredient.

In the conductive paste of the present second invention, the ratio of the metallic particles, the coordinatable sulfur-containing compound and the resin can be selected, so that the coordinatable sulfur-containing compound performs as the hardening agent for the resin and the metallic particles can contact with each other or get closer to each other to exhibit sufficient conductivity after the resin volumetrically shrinked and hardened.

The conductive paste of the present second invention may contain the other optional ingredient in addition to the metallic particles, the coordinatable sulfur-containing compound and the resin, which other optional ingredient may be suitably selected depending on the applications of the conductive paste.

The conductive paste of the present second invention can be prepared through any available and suitable methods. In such methods, it is preferable that the constituent ingredients such as the metallic particles and the coordinatable sulfur-containing compound (without at least the resin) are firstly prepared, and thereafter the remainder ingredients containing the resin are combined with the above prepared constituents to obtain the conductive paste so as to prevent the coordinatable sulfur-containing compound from performing as the hardening agent for the resin (i.e. so as to prevent causing hardening of the resin) before the coordinatable sulfur-containing corn pound make coordinate bonds with the surfaces of the metallic particles. It is preferable for the metallic particles being used for preparation of the conductive paste that they have sufficient chemical activity so that the coordinatable sulfur-containing compound can make coordinate bonds with the surfaces of the metallic particles, i.e. the surface of the metallic particles are exposed without being coated with for example with oxidized film-layer.

The management and the handling of the conductive paste of the present second invention as mentioned in the above during production are easy, so that the present conductive paste may be used for various applications. For example, the present conductive paste may be used as the material for forming a circuit wiring pattern on a circuit board; for forming conductive connections among a plurality of circuit wiring patterns on a plurality of circuit boards (including double sided circuit boards); and for bonding materials for forming mounted electric components.

In accordance with the second aspect of the present second invention, there is provided a method of preparing a circuit board having a circuit-wiring pattern on the surface of said board comprising:

applying a conductive paste of the present second invention to a circuit board in a pattern corresponding to the desired circuit wiring pattern;

subjecting the conductive paste to any of ultraviolet ray irradiation, electron ray irradiation and heating operation, thereby dissociating the sulfur-containing compound from the surface of the metallic particles; and causing the sulfur-containing compound to operate the hardening agent, thereby hardening the resin, wherein the above steps are performed in the above sequence.

Such a method has an advantage that management and the handling of the conductive paste during production are easy, so that the method can be performed at a relatively low temperature compared with the method using conventional conductive pastes. When the conductive paste containing the nano-sized metallic particles is used in the above method, a circuit board having low and stable wiring resistivity can be provided.

In accordance with the third aspect of the present second invention, there is provided a method of preparing a circuit board having a circuit-wiring pattern on the surface of said board comprising:

subjecting a conductive paste of the present second invention to any of ultraviolet ray irradiation, electron ray irradiation and heating operation, thereby dissociating the sulfur-containing compound from the surface of the metallic particles;

applying the conductive paste to a circuit board in a pattern corresponding to the desired circuit wiring pattern; and causing the sulfur-containing compound to operate the hardening agent, thereby hardening the resin, wherein the above steps are performed in the above sequence.

Such a method has an advantage that management and the handling of the conductive paste during production are easy, so that the method can be performed at a relatively low temperature, preferably with least heating of the circuit board and the other parts optionally arranged on the board, compared with the method using conventional conductive pastes. When the conductive paste containing the nano-sized metallic particles is used in the above method, a circuit board having low and stable wiring resistivity can be provided.

In accordance with the fourth aspect of the present second invention, there is provided a method of preparing a multilayered circuit board, wherein a plurality of wiring layers are superposed on each other and at least two wiring layers are electrically connected to each other through one or more holes penetrating the circuit board, comprising:

subjecting a conductive paste of the present second invention to any of ultraviolet ray irradiation, electron ray irradiation and heating operation, thereby dissociating the sulfur-containing compound from the surface of the metallic particles;

filling the conductive paste in one or more holes of the circuit board; and causing the dissociated sulfur-containing compound to operate the hardening agent, thereby hardening the resin, wherein the above steps are performed in the above sequence.

Such a method has an advantage which is similar to the method of the third aspect of the present invention. When the conductive paste containing the nano-sized metallic particles is used in the above method, a multilayered circuit board having at least one electric connections among superposed wiring layers having low and stable connection resistivity can be provided.

Further, the multilayered circuit board can be prepared by a method comprising:

filling the present conductive paste in holes of the circuit board;

subjecting the conductive paste to heating operation, thereby dissociating the sulfur-containing compound from the surface of the metallic particles; and causing the dissociated sulfur-containing compound to operate the hardening agent, thereby hardening the resin, wherein the above steps are performed in the above sequence.

In accordance with the fifth aspect of the present second invention, there is provided a method of preparing an "electric-component mounted body" having one or more circuit boards to which one or more electric components are mounted, comprising:

applying the conductive paste of the present second invention to a circuit board in a pattern corresponding to the desired circuit wiring pattern;

subjecting the conductive paste to any of ultraviolet ray irradiation, electron ray irradiation and heating operation, thereby dissociating the sulfur-containing compound from the surface of the metallic particles;

arranging one or more electric components on the circuit board so that the electric components contact with the conductive paste; and causing the dissociated sulfur-containing compound to operate the hardening agent, thereby hardening the resin, wherein the above steps are performed in the above sequence.

Such a method has an advantage which is similar to the method of the second aspect of the present invention. When the conductive paste containing the nano-sized metallic particles is used in the above method, an electric-component mounted body having bonding portions having low and stable wiring resistivity can be provided.

In accordance with the sixth aspect of the present second invention, there is provided a method of preparing an electric-component mounted body having one or more circuit boards to which one or more electric components are mounted, comprising subjecting the conductive paste of the present second invention to any of ultraviolet ray irradiation, electron ray irradiation and heating operation, thereby dissociating the sulfur-containing compound from the surface of the metallic particles;

applying the conductive paste to a circuit board in a pattern corresponding to the desired circuit wiring pattern;

arranging one or more electric components on the circuit board so that the electric components contact with the conductive paste; and causing the dissociated sulfur-containing compound to operate the hardening agent, thereby hardening the resin, wherein the above steps are performed in the above sequence.

Such a method has an advantage which is similar to the method of the third aspect of the present invention. When the conductive paste containing the nano-sized metallic particles is used in the above method, an electric-component mounted body having connecting portions having low and stable wiring resistivity can be provided.

The third invention of the present application is characterized in that each of the bonding material of the first invention and the conductive paste of the second invention further contains a fragrance material.

The conductive bonding material of the third invention is characterized in that it has a conductive particle ingredient as the metallic particles and the fragrance material has a reducing ability.

In the sealing agents or the adhesives of two-component epoxy resin containing epoxy resins as the main ingredient, the problems relating to bad stench from the compounds having a thiol group (or a mercapto group) are discussed. For example, a method of masking the bad stench from the thiol group by adding vanillin, lemon oil and/or ester-based solvents (for example, see Japanese Patent Kokai Publication No. 04/23882) or a method of absorbing low molecular weight mercaptans being the bad stench ingredients by Sepiolite which is hydrated magnesium silicate mineral (for example, see Japanese Patent Kokai Publication No. 10/60097) are proposed.

Comparing with the above adhesives of two-component epoxy resin, when the conductive paste of one-component epoxy resin is used, the problems relating to the bad stench are diluted since mixing treatment is not required when it is used. However, the problems are not completely dissolved.

The inventors have completed the present invention as a result of extensive and intensive efforts, while paying attention to the masking of the bad stench.

In accordance with the first aspect of the present third invention, there is provided a conductive paste comprising metallic fillers, resin and a hardening agent for hardening the resin, and a fragrance material.

In the conductive paste in the present third invention, bad stench can be masked by the perfume from the fragrance material although the resin and/or hardening agent emanates bad stench since the fragrance material is added to the conductive paste. Thus, uncomfortable sense that the operator feel are decreased, rather preferably, the operator can feel comfortable sense by using the conductive paste.

Further, according to the conductive paste of the third invention, the perfume is emanated from the fragrance material before the hardening reaction is completed, however no or little perfume is emanated from the resin after the hardening reaction is completed. Thus, the operator can confirm completion of the hardening reaction based on the absence of the perfume (or the extent of the strength of the perfume) from the paste by his olfactory perception or any detecting machine, even if the conductive fillers are not transparent.

In the present third invention, the term fragrance material (or fragrant ingredient) means the materials which emanate good perfume (or diffuse an aroma) and give pleasant feeling to a human by stimulating his olfactory perception as generally acknowledged. The fragrance material may contain, in addition to the ingredient emanating fragrant or aroma, i.e. fragrant ingredient, the other ingredient. Further, the fragrance material may be natural fragrance material or synthetic fragrance material, or blended fragrance material which is made by combining two or more fragrance materials of the group consisting of natural fragrance materials and synthetic fragrance materials.

The natural fragrance materials comprise a fragrant oil (essential oil) which is extracted from bodies of animals and/or botanicals. Examples of animal natural fragrance materials are musk, civet, castoreum and ambergris, wherein each fragrant ingredient thereof is muscone, civetone, castoreum and ambrein. The botanical natural fragrance material mainly consists of fragrant oils obtained from flowers, fruits, tree bark or leaves of plants. Examples thereof are anise oil, orange oil, cassia oil, clove oil, sandalwood oil, citronella oil, camphor oil, spearmint oil, geranium oil, turpentine oil, pine oil, peppermint oil, petitgrain oil, bergamot oil, bois de rose oil, eucalyptus oil, lime oil, Lavender oil, lemon class oil and lemon oil, wherein each fragrant ingredient thereof is, for example, anethole, eugenol, cadinene, carvone, coumalin, geraniol, acetate esters (for example, cinnamyl acetate, linalol acetate, menthyl acetate), safrole, methyl salicylate, santalol, citral, citronellal, cineole, camphor, cinnamic aldehyde, terpineol, decyl aldehyde, vanillin, alpha-pinene, beta-pinene, myrcene, menthol, menthone, linalool and limonene.

On the other hand, examples of the synthetic fragrance materials contain ionone, hydroxycitronellal, heliotropine, beta-naphthol methyl ether, gamma-undecalactone, gamma-nonalactone, methylphenylglycide acid ethyl, maltol, cyclotene, ethylmaltol, vanillin and ethylvanillin (or bourbonal), each of which may be used solely or as a mixture of two or more.

In one embodiment of the conductive paste of the present third invention, the resin is an epoxy resin and the hardener agent is a compound which has a thiol group. Those conductive paste has an advantage that it hardens quickly at a relatively low temperature and that the bad stench particularly emanated from the compound having a thiol group can be masked by the fragrance materials. Therefore, the present conductive paste can be used in the appliances that are used in human's living environment such as electric/electronic components wherein bad stench is an unfavorable problem, for example, portable devices, devices used for processing or preservation of foods and devices used for health and beauty.

In a preferable embodiment of the present third invention, the conductive filler is metallic particles, and the fragrance material contains an ingredient which has a reducing ability (hereinafter, merely also referred to as "reducible ingredient"). The metallic particles can be oxidized by air and so on and can be sulfurated by the compound having a thiol group. In such case, the material produced through the hardening of the conductive paste shows higher volumetric resistivity compared with the material in which the surface of the metallic particles is not coated with oxides and/or sulfide. On the other hand, in accordance with the above-mentioned embodiment of the present third invention, oxidation and/or sulfurization of the surface of the metallic particles can be prevented by adding reducible ingredients containing the fragrance material to the conductive paste, so that increasing the volumetric resistivity of the hardened product due to the oxidation and/or sulfurization can be avoided. The "metallic particles" used in the present third invention may be particles consisting of a single kind of metal or alloys of such as soldering materials, preferably the lead-free soldering materials.

However, the present third invention is not limited to the above matters. For example, the conductive fillers may be not only metallic particles, but also particles of powders made of carbon and also the other conductive polymer. As the resin, not only epoxy resin but also phenol resin may be used. The hardening agent may be selected from for example amine-based compounds or phenol-based compounds other than thiol-based compounds depending on the resin to be used. Further, the conductive paste of the present third invention can comprise, in addition to the conductive fillers, the resin, the hardening agent and the fragrance material, any other optional ingredient.

In the conductive paste of the present third invention, the ratio of the conductive fillers, the resin, the hardening agent, the fragrance material and the optionally added ingredient are selected so that the conductive fillers come to contact with each other or get closer to each other to exhibit sufficient conductivity after the resin volumetrically shrinked and hardened. In particular, the ratio of the fragrance material may be selected depending on the kind and the level (or strength) of the stench from the ingredient emanating bad stench to be masked, as well as the kind and the level of the perfume of the fragrance material.

The present conductive paste can be prepared by any suitable methods, for example, by merely mixing or kneading the constituent materials.

The conductive paste of the present third invention as explained in the above can be used for various applications, for example, as the material for bonding materials for forming mounted electric components; for forming a circuit-wiring pattern on a circuit board; and for forming conductive connections among a plurality of circuit wiring patterns on a plurality of circuit boards.

In accordance with another aspect of the present third invention, there is provided a method of preparing an electrical/electronic device having circuit boards, which boards are equipped with conductive hardened products formed from a conductive paste through hardening of the resin ingredient contained in the conductive paste, comprising:
(a) applying the conductive paste of the present third invention to a circuit board at a desired region thereof;
(b) hardening the resin ingredient in the conductive paste by a hardening agent;
(c) checking presence or absence of perfume of a fragrance material contained in the conductive paste in order to confirm completion of the hardening reaction, wherein the above steps are performed in the above sequence.

According to the preparing method of the present third invention, the hardening reaction of the conductive paste is not completed while the perfume of the fragrance material is present. When the perfume of the fragrance material disappears, the operator can determine that the hardening reaction of the conductive paste is completed. Accordingly, the operator can easily determine completion of the hardening reaction rather than the case where completion of the hardening reaction is determined by the change of the color tone. Therefore, it is possible to establish a method of preparing an electrical/electronic device having improved quality reliability.

When the operator determines that, the perfume of the fragrance material still remains, the hardening reaction is not completed. Thus, it is preferable for the operator to repeat the steps (b) and (c) in the above method until the perfume of the fragrance material disappears.

In accordance with another aspect of the present third invention, there is provided an electrical/electronic device equipped with conductive hardened products formed from a conductive paste of the present third invention through hardening of the resin ingredient contained in the conductive paste. Those devices have an advantage of improved quality reliability. The electrical/electronic device of the present third invention comprises for example an electric-component mounted body wherein one or more electric components are mounted on a circuit board by the conductive hardened products. Further, the electrical/electronic device of the present third invention comprises a circuit board on which conductive hardened products functions as the circuit wiring pattern, as well as a multilayered circuit board, wherein a plurality of wiring layers are superposed on each other and at least two wiring layers are electrically connected to each other with the conductive hardened products filling one or more holes penetrating the circuit board.

Effect of the Invention

In accordance with the first invention of the present application, there is provided a bonding material for preparing a mounted body which can harden at a relatively low temperature and has a improved preservation stability since the bonding material contains a sulfur-containing compound, in particular a reforming agent containing a —SH group which causes the epoxy resin to start hardening reaction in a suitable amount. Further, a method of preparing circuit boards using the bonding material for preparing a mounted body and an electrical/electronic device having such circuit boards are also provided.

In accordance with the second invention of the present application, there is provided a conductive paste containing a coordinatable sulfur-containing compound, which makes coordinate bond at the end group thereof with the surface of the metallic particles and which functions as hardening agent for the resin when the end group dissociates from the surface of the metallic particles. The state of the coordinated bond of the sulfur-containing compound can be controlled so as to show an improved preservation stability when it is preserved and to cause hardening reaction only when it is desired. In particular, when a coordinatable sulfur-containing compound which functions as a quick and low temperature-hardening agent at the dissociated state is used, a conductive paste which hardens quickly at a low temperature and shows a high preservation stability is realized.

Further, in accordance with the second invention of the present application, there is provided a method of preparing a circuit board, a multilayered circuit board and an electric-component mounted body using the conductive paste as mentioned in the above. Those methods have an advantage that the handling of the conductive paste is easy. In addition, each of the circuit board, the multilayered circuit board and the electric-component mounted body that were prepared using the above methods has an advantage that the connection resistivity of each connection of the circuit board, the multilayered circuit board and the electric-component mounted body is low.

In accordance with the third invention of the present application, there is provided a conductive paste containing a fragrance material, thereby it is possible to reduce or kill bad stench and it is easily determined to confirm completion of the hardening reaction. In particular, epoxy resin and a compound having a thiol group as the hardening agent are used in one-component conductive paste which can harden at a relatively low temperature, the bad stench emanated from the compound having a thiol group can be masked by the perfume from the fragrance material. Accordingly, the conductive paste may be used for broad applications, for example, the portable devices, the devices used for processing or preservation of foods and the devices used for health and beauty.

In accordance with the method of preparing the electrical/electronic device of the invention of the present application, completion of the hardening reaction can be easily determined on the basis of the presence or absence of the perfume of the fragrance material by using the conductive paste of the third invention. Therefore, it is possible to prepare an electrical/electronic device having high quality reliability.

EXPLANATION OF REFERENCE NUMERALS

Figure 1:
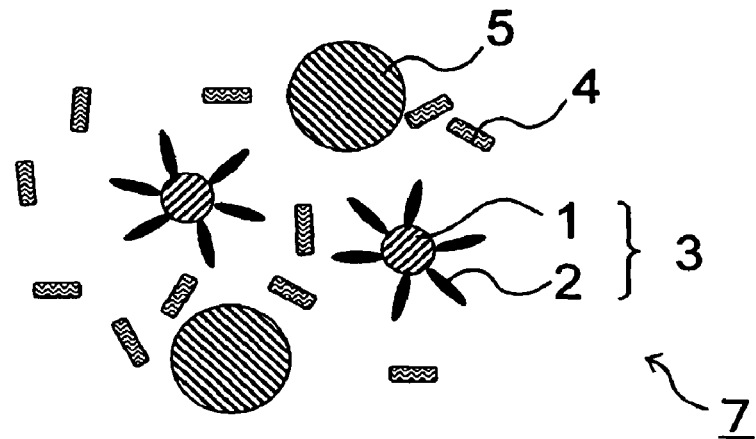
FIG. 1 is a schematic view of the conductive paste in the third embodiment of the second invention.
Figure 1:
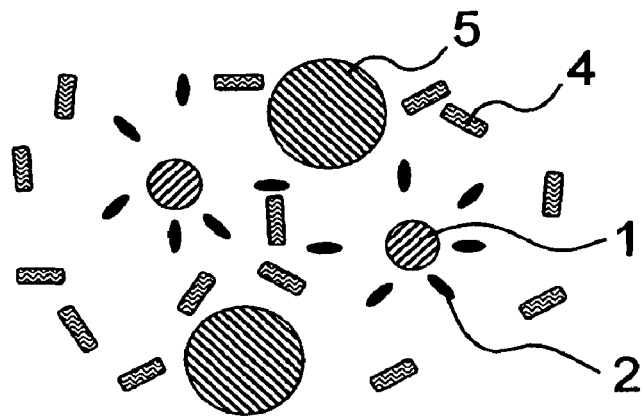
Figure 1:
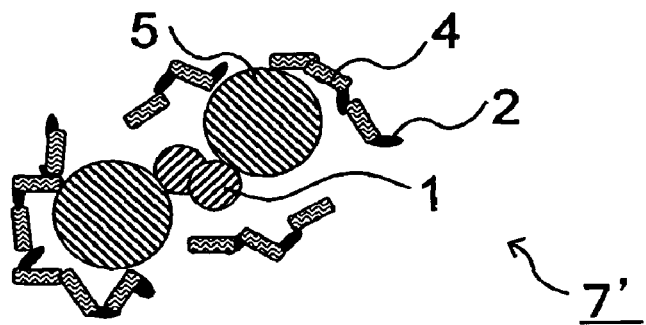
Figure 2:
FIG. 2 is a schematic flow sheet of cross sectional view of preparing a circuit board in the forth embodiment of the second invention.
Figure 2:
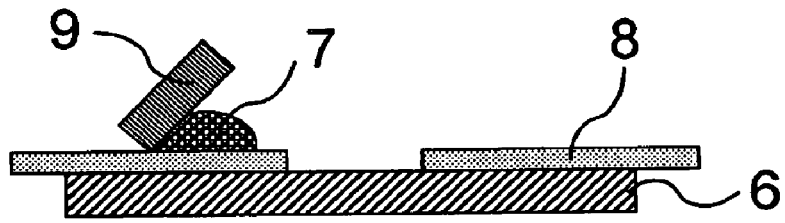
Figure 2:
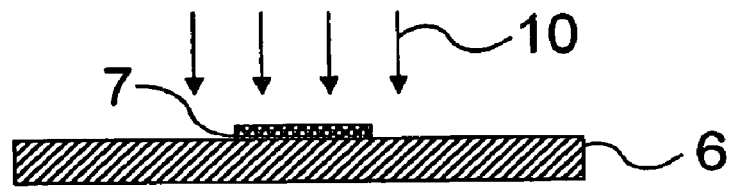
Figure 2:

1: first metallic particle; 2: a sulfur-containing compound; 3: a compound coordinated with metal; 4: resin; 5: second metallic particle; 6, 6': board; 7: conductive paste; 7': conductive hardened product; 8: mask; 9: squeegee; 10: ultraviolet ray or electron ray; 11: hole; 12a, 12b: wiring layer; 13: circuit board; 14: an electric components.

First Embodiment

First Invention

The present embodiment relates to a bonding material for preparing a mounted body (or conductive adhesive).

The bonding material in the present embodiment is one-component composition comprising an epoxy resin ingredient, a latent hardening agent for hardening the epoxy resin, a conductive particle ingredient and a sulfur-containing compound. Although it is not indispensable ingredient, the present bonding material preferably contains the other ingredient such as thickening agent.

The bonding material contains the sulfur-containing ingredient about 1-100 parts by weight, preferably about 2-80 parts by weight based on 100 parts by weight of the epoxy resin. As to the other ingredients, without being limited to, for example, the bonding material may contain about 0.1-30 parts by weight of the latent hardening agent, about 100-1000 parts by weight of the conductive particles, and optionally about 0.5-25 parts by weight of the thickening agent (each based on 100 parts by weight of the epoxy resin).

It is possible to use un-hardened epoxy resin, i.e. a resinous material having two or more epoxy groups in one molecule as the epoxy resin. For example, epoxy resins which are known in the prior art, such as glycidyl ether type epoxy resins, glycidyl ester type epoxy resins, glycidyl amine type epoxy resins and cyclic aliphatic type epoxy resins may be used. Alternatively, the precursors of such compounds may be also used.

The latent hardening agent for hardening the epoxy resin is a hardening agent having functions that, when contained in one-component epoxy resin material (also containing epoxy resin and its hardening agent), the epoxy resin material can be preserved at room temperature (e.g. about 15-30 degree centigrade) for a long time period without changing the property and when heated to a predetermined temperature, it quickly causes the epoxy resin to harden. Examples of the latent hardening agent to be applicable to the first invention are, for example, dicyandiamide, organic acid dihydrazide, aminimide, tertiary amine salt, imidazole salt, salts of Lewis acid and Bronsted acid, preferably latent hardening agent having an amine structure in the molecule thereof (for example, see "epoxy resin handbook", edited by Niiho Masaki, Nikkan Kogyo Shinbun-sya, pp. 225-230).

As the conductive particles, any materials having electroconductivity by itself may be used. For example, particles made of metals such as gold, silver, copper, nickel, silver-palladium alloy and solder alloy, or particles made of the other conductive materials such as carbon can be used. Although the shape and the size of the conductive particles are not particularly limited, the particles may have a number average particle size in a range for example from 0.1 to 50 micrometer.

In the first invention, the term "reforming agent" means one or more compounds that affects at least one of the epoxy resin and the conductive particles to reform the property thereof, for example, to improve the adhesion strength thereof. The reforming agent which is applicable to the first invention has such functions and further has one or more of —SH groups in the molecule. The sulfur-containing compound also being such a reforming agent having one or more of —SH groups in the molecule can lower the hardening temperature thereof due to the presence of the latent hardening agent.

Examples of the sulfur-containing compounds contain mercapto-propionic acid derivatives (for example, 3-mercapto-propionic acid, methoxybuthyl mercaptopropinate, octyl mercaptopropinate, tridecyl mercaptopropinate, trimethylolpropane tris(mercaptopropionate) and pentaerythritol tetrakis-thiopropionate); thioglycol acid derivatives (for example, thioglycol acid, ammonium thioglycolate, monoethanolamine thioglycolate, methyl thioglycolate, octyl thioglycolate, methoxybuthyl thioglycolate, ethyleneglycol bisthioglycolate, butanediol bisthioglycolate, trimethylolpropane tris(thioglycolate), pentaerythritol tetrakis(thioglycolate)); and thiols (thiomalic acid, stearyl mercaptan, 2-mercapto-ethyloctanoate ester, 4-mercaptopyrizine, 2-mercaptopropionic acid.

Alternatively, a sulfur-containing compound which does not have a —SH group, but can produce a —S— group may be used as the sulfur-containing compound. For example, thiirane and cyclic or linear thiirane derivatives (for example, salts and complexes of thiirane) can attain the same effects in the first invention.

As the thickening agent, typical inorganic thickening materials (or thixotropic agent) can be used. Further, the other optional additives, e.g. hardening promoting agents, fillers, pigments, dyes, flexibility adding agent and dispersants can be optionally added.

The bonding material for preparing a mounted body of the present embodiment can be prepared by appropriately mixing or kneading the constituent materials.

The bonding material of the present embodiment is grasped as a conductive adhesive and is understood that it do not show any electroconductivity before it hardens. However, when the bonding material is heated, the epoxy resin volumetrically shrinks and hardens, so that the conductive particles therein come to contact one another or get closer to each other, thereby shows electroconductivity. Since the bonding material of the present embodiment contains a sulfur-containing compound, which causes hardening of the epoxy resin at a proper amount, the present bonding material can be stably preserved for relatively long time, at least over seven days. In addition, the present bonding material can harden at a relatively low temperature, particularly at a temperature in a range from 70 to 110 degree centigrade.

Second Embodiment

First Invention

The present embodiment relates to the method of preparing circuit boards and electric/electronic devices containing such circuit boards.

First, a bonding material of the first invention as mentioned in the above first embodiment is applied to the electrode (or land) of a board. The bonding material can be applied by any of various methods, for example, transfer printing, screen printing or dispensing. A board, which is generally known in the technical field, comprises an insulating board (substrate) and a circuit-wiring pattern, wherein the circuit-wiring pattern is integrally formed on the board can be used.

Next, an electric component is arranged onto the circuit board so that the electrodes of the electric component are suitably aligned with and contacted with the bonding material on the board.

Then, the obtained board is subjected to heating, for example by passing through a reflow oven, thereby the bonding material is maintained at a temperature condition in a range between 70 to 110 degree centigrade for suitable period of time, for example from 0.5 to 10 minutes. As a result, the epoxy resin sufficiently hardens to bond the electrode of the board with the electrode of the electric component, and thereby the conductive particles therein come to contact one another or get closer to each other to show electroconductivity. Accordingly, the electric component can be mechanically and electrically bonded with the electrode of the board by the hardened adhesive.

The electric component used in the present embodiment is sufficient to have an allowable temperature limit which is higher than the heating temperature. For example, an electric component having an allowable temperature limit lower than 120 degree centigrade may be used in the present embodiment as far as its allowable temperature limit is higher than the heating temperature. The heating temperature may be appropriately set in a temperature range from 70 to 110 degree centigrade considering the allowable temperature limit of the electric component so as to obtain sufficient hardening.

A circuit board to which electric components are mounted is prepared according to the above method.

Such circuit board can be used by being built-in various electrical/electronic devices. Examples of such electrical/electronic devices are as follows:

Portable electronic devices such as video-camera, portable CD, portable MD, portable DVD, mobile phone and laptop computer;

Typically stationary settled electronic devices such as stereo set, desk-top type computer, video telephone, DVD player, CD player, DVD recorder, CD recorder and television set;

Home appliance electronic devices such as rice cooking device, microwave oven, refrigerator, cleaner, washing machine, air conditioner, lighting apparatus, intercom, security camera, monitoring camera, gas leakage detector and the toilet seat with the washing functions;

Electronic devices for vehicles, for example for automobile and two-wheeled motor vehicle, such as car stereo, car navigation system, car air-conditioner, car sensor, engine controller, loading camera, automatic brake safe control system (ABS) and headlight.

Second Invention

Hereinafter, various embodiments of the second invention are illustrated in detail with reference to FIGS. 1-6. In the embodiment relating to the second invention, similar members are denoted with the same reference numerals. Unless particularly mentioned, an explanation of one member in one embodiment is also applicable to the other member in the other embodiment.

Third Embodiment

Second Invention

The present embodiment relates to a conductive paste, a method of preparing the conductive paste and a method of using the same in one preferred embodiment of the second invention.

As shown in FIG. 1(a), the conductive paste 7 of the present embodiment comprises a first metallic particles 1, a coordinatable sulfur-containing compound 2 and an insulating resin 4. The coordinatable sulfur-containing compound 2 coordinates at the end group thereof with the surface of the first metallic particles 1 to form metal coordination compounds 3.

The end group of the coordinatable sulfur-containing compound 2 coordinating with the first metallic particles 1 may be for example a thiol group and the sulfur atom therein performs as a coordinating atom. The resin 4 may be for example an epoxy resin. Since the thiol group relates to hardening of the epoxy resin, the coordinatable sulfur-containing compound 2 functions as the hardening agent for the resin 4 when the end group of the coordinatable sulfur-containing compound 2 dissociates from the surface of the metallic particles 1.

The first metallic particles 1 may consist of any of gold, silver or copper. The thiol group (particularly, sulfur atom) of the coordinatable sulfur-containing compound 2 can suitably coordinate with such metallic particles. The mean particle diameter of the first metallic particles 1 may be, for example, in a range from about 1 nm to 100 μm and preferably in a range from about 1 to 100 nm. When the first metallic particles 1 were nano-size particles, they can be dispersed in the resin 4 due to the coordination of the coordinatable sulfur-containing compound 2 thereto. Although merely several particles of resin 4 are imaginarily shown in FIG. 1, there are a lot of particles or constituent elements of resin 4 in the practical reacting system of the conductive paste. Thus, the imaginarily shown particles or constituent elements of resin 4 play a role as dispersion medium.

The conductive paste 7 of the present embodiment may further contain second metallic particles 5 as shown in FIG. 1(a). The second metallic particles 5 may consist of for example gold, silver, copper, platinum, palladium, rhodium, osmium, ruthenium, iridium, iron, zinc, cobalt, nickel, chromium, titanium, tantalum, indium and silicon. The coordinatable sulfur-containing compound 2 may coordinate with the second metallic particles 5 or not. The mean particle diameter of the second metallic particles 5 may be, for example, in a range from about 0.1 to 100 µm, and in particular in a range from 0.1 to 20 µm. However, the conductive paste of the second invention may not contain the second metallic particles 5, without being limited to the above explanation.

In the context of the present specification, the term "mean particle diameter" means a number average particle diameter of the aggregation of the particles. It can be measured by a laser diffraction (light scattering) method, for example using Microtrac particle size analyzers 9320 HRA (available form NIKKISO CO., LTD., Tokyo, Japan).

In the present embodiment, the conductive paste 7 contains the first metallic particles 1, the coordinatable sulfur-containing compound 2, the resin 4 and the second metallic particles 5 if present, in a ratio for example of about 100 parts by weight of the first metallic particles 1, about 60-95 parts by weight of the coordinatable sulfur-containing compound 2, about 30-2 parts by weight of the resin 4 and about 30-2 parts by weight of the second metallic particles 5 if present. Without being limited to the above, the ratio of each ingredient of the present second invention may be selected optionally.

The present conductive paste may further contain the other ingredients as needed, for example hardening promotor, filler, extender, solvent, pigment, plasticity additive and dispersant at an adequate amount.

The conductive paste 7 in the present embodiment can be prepared by mixing the first metallic particles 1 having an exposed surface with the coordinatable sulfur-containing compound 2 to form the metal coordination compounds 3, and then insulating resin 4 is added and mixed with the metal coordination compounds 3. The second metallic particles 5 (as well as the other optional ingredients) may be mixed simultaneously with the first metallic particles 1 and the coordinatable sulfur-containing compound 2 or may be added to the mixture together with the resin 4.

Next, the method to use the above conductive paste 7 is explained.

When an external influences, for example, irradiation of ultraviolet ray or electron ray or heating is applied to the conductive paste 7, the coordinate bond between the first metallic particles 1 and the end groups of the sulfur-containing compound 2 is broken. Thus, the metal coordination compound 3 is dissolved and the sulfur-containing compound 2 dissociates from the surface of the metallic particles 1 as shown in FIG. 1(b). When ultraviolet ray or electron ray is irradiated, the irradiation dose may be optionally adjusted, and the temperature of the conductive paste 7 and the board 6 may increase slightly. When heating is applied, the conductive paste 7 and the board 6 may be heated at a temperature from 60 to 120 degree centigrade for about 5 to 60 minutes, but it is not limited thereto.

The dissociated sulfur-containing compound 2 can operate as the hardening agent for the resin. For example, when heating is applied, it causes the resin 4 to harden as shown in FIG. 1(c) without additional operation. When the resin 4 is epoxy resin and the end group of the sulfur-containing compound 2 is a thiol group, for example, the resin hardens by maintaining the temperature from about 80 to 120 degree centigrade for about 5 to 60 minutes. Alternatively, the resin hardens by irradiation of ultraviolet ray or electron ray.

When a heating operation is performed to harden the resin 4, this operation can be performed at a condition different from the operation to dissociate the sulfur-containing compound 2. However, if it is appropriate, both operations can be combined with together or performed in sequence.

As a result, the epoxy resin 4 volumetrically shrinks and hardens, so that the metallic particles 1 therein come to contact one another or get closer to each other, thereby a hardened product 7' which shows electroconductivity as a whole is formed.

In particular, when the mean diameter of the metallic particles 1 is in a range from about 1 to 100 nm, the metallic particles 1 sinter one another upon dissociating the sulfur-containing compound 2 and/or hardening of the resin 4 by being heated at a temperature from about 25 to 110 degree centigrade for about 2 to 30 minutes. Thus, the obtained conductive hardened product 7' shows very low resistivity. In addition, since the metallic particles 1 are sintered one another, the resistivity of the conductive hardened product 7' is substantially not influenced by the volume change of the hardened resin 4 due to a temperature change.

Thus, according to the conductive paste of the present embodiment, it is possible to attain a high stability when preserved and to cause harden only when desired. The conductive paste of the present embodiment may form a conductive hardened product by using at a relatively low temperature. Further, the resistivity of the obtainable hardened product may be further lowered and stabilized by using nano-size metallic particles as the conductive paste and sintering them.

Fourth Embodiment

Second Invention

The present embodiment relates to a method of preparing a circuit board in one embodiment of the second invention.

First, an insulated board (or substrate) 6 is provided, as shown in FIG. 2(a). Any material selected from polyethylene terephthalate, polyethylene naphthalate, polycarbonate, polyimide, thermoplastic resin, aramide nonwoven and glass nonwoven may be used as the board 6, but it is not limited thereto.

Then, as shown in FIG. 2(b), for example the conductive paste 7 as mentioned in the first embodiment is applied to the board 6 in a pattern corresponding to the desired circuit wiring pattern. Any method selected from screen printing, ink-jet printing, dispensing by dispenser, impregnation, spin-coating may be applicable. FIG. 2(b) schematically shows a screen printing method, wherein squeegee 9 is pressingly moved over a mask 8, so that the conductive paste 7 is printed on the board 6 through openings of desired pattern in the mask 8. After printed, the mask 8 is removed from the board 6.

Then, the conductive paste 7 on the board 6 is irradiated with ultraviolet ray or electron ray 10 or the conductive paste 7 is heated together with the board 6. Thus, the sulfur-containing compound coordinated with the surface of the metallic particles in the conductive paste 7 dissociates from the surface of the metallic particles.

Then the resin is hardened by causing the dissociated sulfur-containing compound to operate the hardening agent, thereby a hardened product 7' is obtained as shown in FIG. 2(d). It is preferable that the resin hardens quickly at a relative low temperature. For example, in the case where heating operation is required, the hardening preferably starts after the dissociation without any additional operation.

As explained in the above, a circuit board having a circuit wiring pattern made of the conductive hardened product 7' on the surface of said board 6 is prepared.

According to the method of preparing circuit board in the present embodiment, since the conductive paste of the second invention is used as the material for preparing the circuit wiring pattern, a good preservation stability is attained and easier handling during preparation is also attained. In addition, it is after the conductive paste was applied onto the board that the sulfur-containing compound dissociates from the surface of the metallic particles. Thus, there is no danger that the resin starts to harden before or during application of the conductive paste to the board, so that it is not necessary to pay particular attention to handling. Further, it is possible to prepare a circuit board having a desired circuit wiring pattern at a relatively low temperature. In addition, when the conductive paste containing the nano-sized metallic particles is used in the above method, a circuit board having low and stable wiring resistivity can be provided.

Fifth Embodiment of the Second Invention

The present embodiment relates to a method of preparing a circuit board in another embodiment in the present second invention. The present embodiment is a modified version of the forth embodiment, so that the difference from the forth embodiment is mainly explained hereinafter.

Figure 3:
FIG. 3 is a schematic flow sheet of cross sectional view of preparing a circuit board in the fifth embodiment of the second invention.
Figure 3:
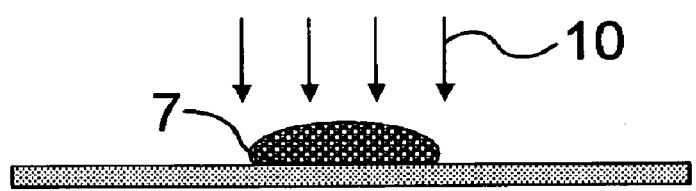
Figure 3:
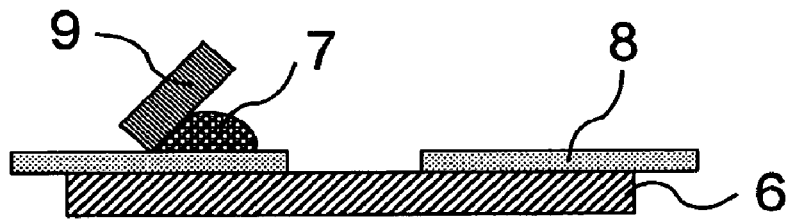
Figure 3:

First, an insulated board (or substrate) 6 is provided, as shown in FIG. 3(*a*).

Separately, a conductive paste 7 as explained in the first embodiment is irradiated with ultraviolet ray or electron ray 10 or the conductive paste 7 is heated as shown in FIG. 3(*b*), so that the sulfur-containing compound coordinated with the surface of the metallic particles is dissociated from the surface of the metallic particles.

Then, the above conductive paste 7 is applied to the board 6 in a pattern corresponding to the desired circuit wiring pattern as shown in FIG. 3(*c*). In the present embodiment, it is preferable that the conductive paste 7 does not substantially start hardening reaction after the sulfur-containing compound was dissociated from the surface of the metallic particles and before the application completes.

Then, the dissociated sulfur-containing compound causes hardening reaction of the epoxy resin to obtain a conductive hardened product 7' as shown in FIG. 3(*d*). It is preferable that the resin hardens quickly and at a relatively low temperature. Such a hardening reaction can be caused by heating the conductive paste 7' together with the board 6.

As mentioned in the above, a circuit board having a circuit wiring pattern made of the conductive hardened product 7' on the surface of said board 6 is obtained.

According to the method of preparing circuit board in the present embodiment, since the conductive paste of the second invention is used as the material for preparing the circuit wiring pattern, a good preservation stability is attained and easier handling during the preparation is also attained. In addition, since the sulfur-containing compound has been dissociated from the surface of the metallic particles before the conductive paste is applied to the board, it is not necessary to expose the board to ultraviolet ray or electron ray or to heat the board. Thus, it is possible to prepare a circuit board having a desired circuit wiring pattern at a relatively low temperature, with avoiding heating the board and devices optionally existing on the board as far as possible. In addition, when the conductive paste containing the nano-sized metallic particles is used in the above method, a circuit board having low and stable wiring resistivity can be provided.

Sixth Embodiment of the Second Invention

The present embodiment relates to a method of preparing a multilayered circuit board, in particular a double sided circuit board in one embodiment of the second invention.

Figure 4:
FIG. 4 is a schematic flow sheet of cross sectional view of preparing a multilayered circuit board in the sixth embodiment of the second invention.
Figure 4:
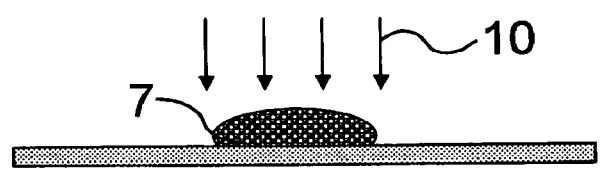
Figure 4:
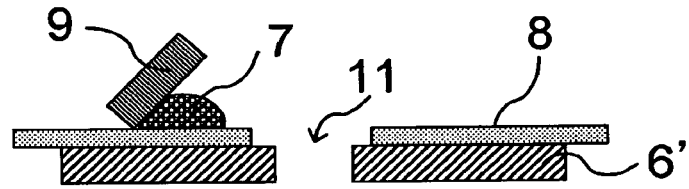
Figure 4:
Figure 4:
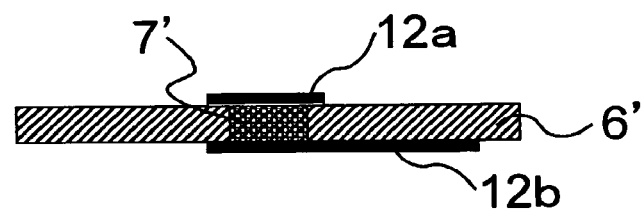
Figure 5:
FIG. 5 is a schematic flow sheet of cross sectional view of preparing an electric-component mounted body in the seventh embodiment of the second invention.
Figure 5:
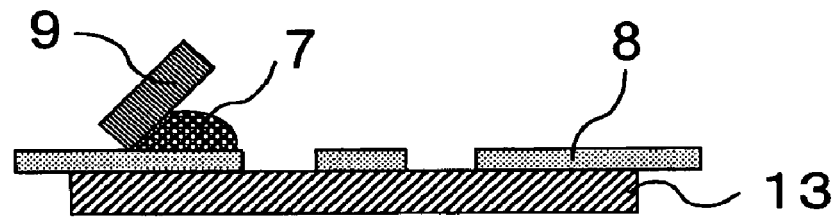
Figure 5:
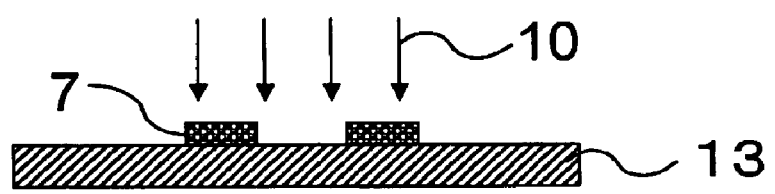
Figure 5:
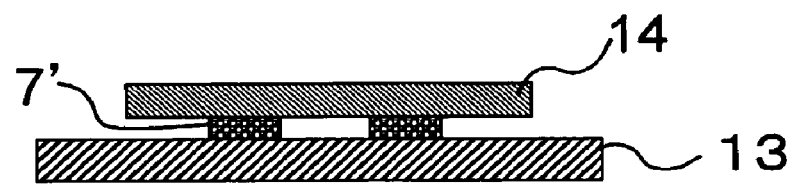
Figure 6:
FIG. 6 is a schematic flow sheet of cross sectional view of preparing an electric-component mounted body in the eighth embodiment of the second invention.
Figure 6:
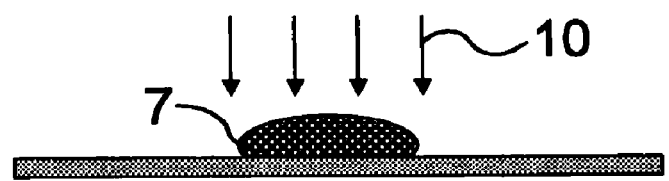
Figure 6:
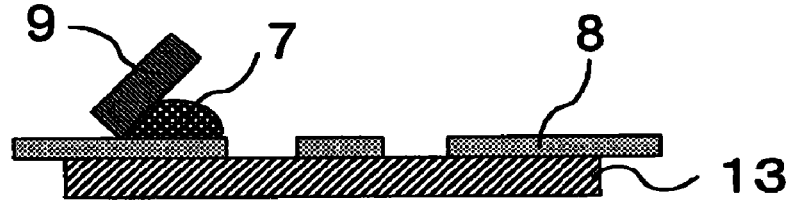
Figure 6:
Figure 6:
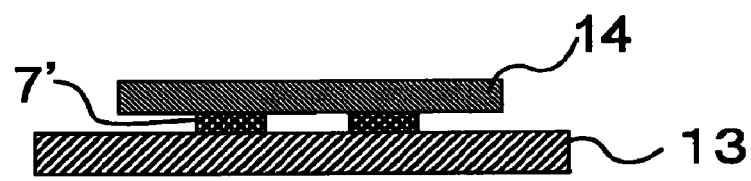

First, a substrate 6' having a penetrating hole 11 at an adequate position is provided, as shown in FIG. 4(*b*). This substrate 6' is the same as that of the above forth embodiment and to which substrate a hole 11 is formed through machining processing such as drilling or punching or thermal processing such as laser irradiation.

Separately, a conductive paste 7 as explained in the first embodiment is irradiated with ultraviolet ray or electron ray 10 or the conductive paste 7 is heated as shown in FIG. 4(*b*), so that the sulfur-containing compound coordinated with the surface of the metallic particles is dissociated from the surface of the metallic particles.

Then, the above conductive paste 7 is applied to the hole 11 of the board 6' as shown in FIG. 4(*c*). Any method selected from screen printing, ink-jet printing, dispensing by dispenser, impregnation, spin-coating may be applicable to fill the hole 11. FIG. 4(*c*) schematically shows a screen printing method. In the present embodiment, it is preferable that the conductive paste 7 does not substantially start hardening reaction after the sulfur-containing compound was dissociated from the surface of the metallic particles and before the application completes Then, the dissociated sulfur-containing compound causes hardening reaction of the epoxy resin to obtain a conductive hardened product 7'. It is preferable that the resin hardens quickly and at a relatively low temperature. Such a hardening reaction can be caused by heating the conductive paste 7' together with the board 6.

Then, as shown in FIG. 4(*e*), a wiring layer 12a is formed on the top side of the substrate 6' and another wiring layer 12b is formed on the bottom side of the substrate 6'. The wiring layer 12a is electrically connected with the wiring layer 12b via the conductive hardened product 7' which fills the through hole 11. Each wiring layer can be formed according to the methods explained in the above second or third embodiment. Alternatively, a method to form a wiring layer which is known in the prior art can be also applicable.

As above mentioned, a multilayered circuit board having wiring layers 12a and 12b on both sides of the board and the conductive hardened product 7' forming a conductive path between both wiring layers 12a and 12b is obtained.

According to the method of preparing circuit board in the present embodiment, since the conductive paste of the second invention is used as the material for preparing the circuit wiring pattern, a good preservation stability is attained and easier handling during the preparation is also attained. In addition, since the sulfur-containing compound is dissociated from the surface of the metallic particles before the conductive paste fills the hole of the board, it is not necessary to expose the board to ultraviolet ray or electron ray or to heat the board. Thus, it is possible to prepare a circuit board having a desired circuit wiring pattern at a relatively low temperature, with avoiding heating the board and devices optionally existing on the board as far as possible. In addition, when the conductive paste containing the nano-sized metallic particles is used in the above method, a multilayered circuit board having an electric connections having low and stable wiring resistivity can be provided.

In the above embodiment, a multilayered circuit board, in particular a double sided circuit board wherein two wiring layers are arranged on both sides of the board is explained. However, a multilayered circuit board having more layers, wherein each layer has two wiring layers on both sides can be obtained by a method which is similar to the method explained in the present embodiment. Although the wiring layers 12a and 12b were formed on the board 6' after the hole 11 was filled with the conductive paste 7. In the present embodiment, filling the conductive paste 7 can be performed after forming both wiring layers 12a and 12b on the board 6'.

In the present embodiment, the conductive paste is irradiated with ultraviolet ray or electron ray or the conductive paste is heated together with the board, and then such a conductive paste is filled in the hole which was formed on the board. However, in the case where the dissociation is caused by heating, untreated conductive paste is filled in the hole of the board, and then the conductive paste can be heated together with the board, thereby the sulfur-containing compound coordinated with the surface of the metallic particles in the conductive paste can be dissociated from the surface of the metallic particles. Thus, the dissociated sulfur-containing compound may perform as hardening agent to obtain a hardened resin.

Seventh Embodiment

Second Invention

The present embodiment relates to a method of preparing an electric-component mounted body in one embodiment of the second invention.

First, a circuit board 13 is provided as shown in FIG. 5(a) (wherein any wiring layer is not shown). The circuit board 13 can be formed according to the methods explained in the above second or third embodiment or can be formed by a method which is known in the prior art or can be commercially available one.

Next, the conductive paste 7 explained in the above first embodiment is applied to the circuit board 13 at a desired region, for example to lands (not shown) which are electrically connected with any wiring layer as shown in FIG. 5(b). The method used in the forth embodiment can be adopted as the applying method. FIG. 5(b) schematically shows a screen printing method.

Then, the conductive paste 7 on the board 13 is irradiated with ultraviolet ray or electron ray 10 or the conductive paste 7 is heated together with the board 13. Thus, the sulfur-containing compound coordinated with the surface of the metallic particles in the conductive paste 7 dissociates from the surface of the metallic particles.

Next, an electric component 14 is arranged onto the circuit board 13 so that the electric component is suitably aligned with and contacted with the conductive paste 7 on the board 13.

Then the resin is hardened by causing the dissociated sulfur-containing compound to operate the hardening agent, thereby a conductive hardened product 7' is obtained as shown in FIG. 5(d). It is preferable that the resin hardens quickly at a relative low temperature. For example, in the case where heating operation is required, the hardening preferably starts after the dissociation without any additional operation.

As a result, the electric component 14 is mechanically and electronically bonded to the wiring circuit board 13 by means of the conductive hardened products 7' which is arranged between the wiring circuit board 13 and the electric component 14, so that the electric component 14 is mounted on the circuit board 13.

As explained in the above, an electric-component mounted body having bonding portions (or connecting regions) wherein the conductive hardened product 7' forms the connecting regions mounting the electric component 14 on the circuit board 13 can be prepared.

According to the method of preparing the electric-component mounted body in the present embodiment, since the conductive paste of the second invention is used as the material for bonding material for mounting, good preservation stability is attained and easier handling during the preparation is also attained. In addition, it is after the conductive paste was applied onto the board that the sulfur-containing compound dissociates from the surface of the metallic particles. Thus, there is no danger that the resin starts to harden before or during application of the conductive paste to the board, so that it is not necessary to pay particular attention to handling. Further, it is possible to prepare a circuit board having a desired circuit wiring pattern at a relatively low temperature. In addition, when the conductive paste containing the nano-sized metallic particles is used and sintered in the above method, an electric-component mounted body having conductive connections having low and stable bonding resistivity can be provided.

Eighth Embodiment

Second Invention

The present embodiment relates to a method of preparing an electric-component mounted body in another embodiment of the second invention. This embodiment is a modified version of the seventh embodiment, so that the difference from the seventh embodiment is mainly explained hereinafter.

First, a circuit board 13 is provided, as shown in FIG. 6(a).

Separately, a conductive paste 7 as explained in the first embodiment is irradiated with ultraviolet ray or electron ray 10 or the conductive paste 7 is heated as shown in FIG. 6(b), so that the sulfur-containing compound coordinated with the surface of the metallic particles is dissociated from the surface of the metallic particles.

Then, the above conductive paste 7 is applied to the board 13 at desired regions, for example to the lands (not shown) which is electrically connected with the wiring layer as shown in FIGS. 6(c) and (d). In the present embodiment, it is preferable that the conductive paste 7 does not substantially start hardening reaction after the sulfur-containing compound was dissociated from the surface of the metallic particles and before the application completes Next, an electric component 14 is arranged onto the circuit board 13 so that the electric component 14 is suitably aligned with and contacted with the conductive paste 7 on the board 13.

Then the resin is hardened by causing the dissociated sulfur-containing compound to operate the hardening agent, thereby a conductive hardened product 7' is obtained as shown in FIG. 6(e). It is preferable that the resin hardens quickly at a relative low temperature. For example, hardening of the resin can be caused by heating the conductive paste 7 together with the circuit board 13 and the electric component 14.

As a result, the electric component 14 is mechanically and electronically bonded to the wiring circuit board 13 by means of the conductive hardened products 7' which is arranged between the wiring circuit board 13 and the electric component 14, so that the electric component 14 is mounted on the circuit board 13.

As explained in the above, an electric-component mounted body having bonding portions wherein the conductive hardened product 7' forms the bonding portions mounting the electric component 14 on the circuit board 13 can be prepared.

According to the method of preparing the electric-component mounted body in the present embodiment, since the conductive paste of the second invention is used as the material for bonding material for mounting, good preservation stability is attained and easier handling during the preparation is also attained. In addition, since the sulfur-containing compound is dissociated before the conductive paste is applied to the board, there is no danger that the board is exposed to ultraviolet ray or electron ray or heated for dissociation. Thus, it is possible to prepare a circuit board having a desired circuit wiring pattern at a relatively low temperature, with avoiding heating the board and devices optionally existing on the board as far as possible. In addition, when the conductive paste containing the nano-sized metallic particles is used and sintered in the above method, an electric-component mounted body having conductive connections having low and stable bonding resistivity can be provided.

Third Invention

Ninth Embodiment

Third Invention

The present embodiment relates to a conductive paste in one embodiment of the present third invention.

The conductive paste of the present embodiment comprises metallic particles which is conductive fillers, an epoxy resin, a hardening agent consisting of a compound having a thiol group and a fragrance material.

The metallic particles may be the particles of a single kind of metal selected from the group of gold, silver, copper and nickel, or of an alloy or a mixture comprising two or more kinds of the metals as mentioned in the above, or the particles of the soldering materials of, for example an Sn—Bi based alloy and Sn—Bi—In based alloy, an Sn—Ag based alloy, an Sn—Cu based alloy, an Sn—Ag—Cu based alloy, and one or more of those alloys to which Bi and/or In is further added. The number average particle size of the metallic particles is for example, from about 1 to 50 micrometer, preferably from about 2 to 20 micrometer.

As the epoxy resin, for example bisphenol A type epoxy resin, bisphenol F type epoxy resin and modified epoxy resins thereof may be used.

The compound having a thiol group is desirable in this invention since it performs as the hardening agent for the epoxy resin, in particular makes it possible to harden quickly at a lower temperature. The examples of such compound are for example, thioglycol acid and the derivatives thereof, mercaptopropionic acid and the derivatives thereof, thiomalic acid, mercaptopyrizine, stearyl mercaptan and mercaptoethyloctanoate ester.

As the fragrance material, for example, plant-derived natural fragrance materials having terpene series compounds and the derivatives thereof (in particular, limonen, linalool and citral etc) as the perfume component thereof, such as ionone, hydroxycitronellal, maltol, vanillin and ethylvanillin (or bourbonal) or synthetic fragrance materials may be used.

Particularly, in the embodiment wherein a compound having a thiol group is used, it is preferable to use a fragrance material having so strong perfume that the bad stench emanated from the compound could be masked. As such a fragrance material, synthetic fragrance material or prepared fragrance material is suitable rather than plant-derived natural fragrance materials.

In the case where the metallic particles are made of a metal which is susceptible to being sulfurized, or made of a metal which is susceptible to being oxidized, it is preferable to use fragrance materials which have a reducing ability to reduce or preferably prevent the sulfurization or oxidization of the surface of the metallic particles, thus to reduce or preferably prevent the volume resistivity of the conductive hardened product from being increased, (or, which have more susceptible ability to being sulfurized or being oxidized rather than the metal consisting of the metallic particles). Such fragrance materials are for example a kind of fragrance having a carboxyl group in the molecule, such as cinnamic acid, and a kind of fragrance having an aldehyde group in the molecule, such as vanillin, ethylvanillin, heliotropine, anisaldehyde, amyl cinnamic aldehyde, cinnamic aldehyde, citral, citronellal, decyl aldehyde, hydroxycitronellal. The fragrance material may have an optional form, for example, generally a powder form in the case of vanillin, ethylvanillin and heliotropine, and generally a liquid form in the case of anisaldehyde, amylcinnamic aldehyde, cinnamic aldehyde, citral, citronellal, decyl aldehyde, and hydroxycitronellal.

The conductive paste of the present embodiment may contain the ingredients thereof in a ratio of, for example, about 100 parts by weight of epoxy resin, about 25-600 parts by weight of the metallic particles, about 1-100 parts by weight of the hardening agent and about 1-100 parts by weight of the fragrance materials. However, the ratio thereof may be optionally selected without being limited thereto.

The conductive paste of the present embodiment may contain the other ingredients, for example hardening promoters, fillers, extenders, solvents, pigments, plasticity additives and dispersants at an adequate amount.

The conductive paste of the present embodiment can be prepared through any optional methods, for example by merely mixing or kneading the ingredients, i.e. commercially available metallic particles, epoxy resin, hardening agent, fragrance and optional additional ingredient.

When the conductive paste of the present embodiment is heated, the compound having thiol group performs as a hardening agent for the epoxy resin, thereby the epoxy resin volumetrically shrinks and hardens, so that the metallic particles therein come to contact one another or get closer to each other. After sufficiently hardened, the hardened product shows an improved electroconductivity and emanates substantially no perfume.

According to the conductive paste of the present embodiment, since the particularly bad stench emanated from the compound having a thiol group is masked by the perfume of the fragrance material, on the one hand, the bad and unpleasant stench can be efficiently reduced, and on the other hand, the paste can emanate pleasant perfume. In addition, since the conductive paste of the present embodiment comes not to emanate perfume when the hardening completes, an operator in charge of the mounting performance can easily confirm that the hardening operation has completed. The conductive paste of the present embodiment can be used for the portable devices, the devices used for processing or preservation of foods and the devices used for health and beauty due to the bad stench emanated from the conventional conductive paste.

Tenth Embodiment

Third Invention

The present embodiment relates to a method of preparing the electric-component mounted body in one embodiment of the present third invention.

First, a circuit board made of an insulating material, for example, polyethylene terephthalate, polyethylene naphthalate, polycarbonate, polyimide, epoxy resin, aramide nonwoven, glass woven, glass nonwoven, on at least one side of which board a circuit wiring pattern is formed with a conductive material, for example, copper, gold, a hardened product of a conductive paste is provided. A circuit board which is one of commercially available boards or prepared through the preparing methods known in the prior art can be used as the circuit board.

Then, the conductive paste explained in the above ninth embodiment is applied to desired regions of the circuit board, particularly to the electrodes (for example lands) by a screen printing method. In particular, a mask having one or more openings having a predetermined pattern is arranged on the circuit board, a squeegee is pressingly moved over the mask, so that the conductive paste is printed on the board through the opening in the mask. In order that the printed conductive paste has a uniform thickness, it is preferable that the mask is a metal mask (or made of a metal) and the squeegee is made of a fluorine contained resin. After printing, the mask is removed from the circuit board. In stead of screen printing method, the other method for example ink-jet printing, dispensing by dispenser, impregnation, spin-coating can be applicable to apply the conductive paste on the board at a desired region.

Thereafter, an electric component is arranged onto the circuit board so that the electrodes (for example leads) of the electric component are suitably aligned with and contacted with the bonding material on the board. The way how to arrange may vary depending on the kinds of the electric component. However, it may also be sufficient to merely put the electric component on the conductive paste since the viscosity of the conductive paste decreases and the paste covers the conductive connections in the following heating step. It will be appreciated that another arrangement wherein the electric component is relatively forced on the conductive paste, thereby causing intimate attachment therebetween may be adopted.

When the obtained circuit board is heated, the compound having a thiol group performs as the hardening agent for the epoxy resin in the conductive paste, so that the hardening of the epoxy resin completes. Heating may be performed for example at a temperature of from about 70 to 200 degree centigrade, preferably from about 70 to 120 degree centigrade for about 1.5 to 15 minutes.

When heating is completed, the presence or absence of the perfume of the fragrance material in the conductive paste (or at least partly hardened product) is determined by an inspection. Such inspection may be performed by an operator who have a normal olfactory perception or using inspection machine. When the perfume of the conductive paste is substantially absent, the fragrance ingredient is sealed within the hardened product due to hardening of the conductive paste, so that completion of the hardening operation may be confirmed. When the perfume of the conductive paste remains (containing the case where the perfume still remains although the level of the perfume is reduced compared with before heating), the fragrance ingredient is not sufficiently sealed within the hardened product. Thus, it is considered that the hardening operation is not sufficient, so that completion of the hardening can not be confirmed. Accordingly, in this case, hardening operation and the following inspection should be repeated until the hardening can be confirmed by confirming the absence of the perfume.

In this way, completion of the hardening of the resin in the conductive paste can be confirmed based on the presence or absence of the perfume of the conductive paste.

When completion of the hardening of the resin is confirmed, the conductive paste becomes to be a conductive hardened product. The electric components are mechanically and electronically bonded to the wiring circuit board, thereby mounted.

The electric-component mounted body obtained as mentioned above may be installed in a various electric/electronic components. The electric/electronic components produced by the present embodiment are, for example portable electronic devices such as mobile phone and headphone stereos, the devices used for processing or preservation of foods, for example, rice cooking device, microwave oven, refrigerator, and the devices used for health and beauty, for example, body fat scale, skin moisture measuring system, electric toothbrush and electric shaver.

According to the method of preparing electric/electronic components in the present embodiment, completion of the hardening of the resin in the conductive paste can be confirmed based on the perfume of the conductive paste, so that an inspection at a low cost with a high degree of accuracy can be performed. The electric-component mounted body obtained by the preparing method in the present embodiment, therefore the obtained electric/electronic components attains a high reliability of quality.

Example

Hereinafter, the bonding material for mounting electric devices of any of the first to third inventions of the present application, the circuit boards having such the bonding material and the electric/electronic components being equipped with such circuit boards are illustrated in more detail through Inventive Examples and Comparative Examples.

First Invention

1. The Bonding Material for Mounting Electric Devices

First, an epoxy resin ingredient, a latent hardening agent ingredient, an inorganic thickening materials, conductive particles and reforming agent A as shown below are blended and kneaded in a roll mixer and defoamed by subjecting the blend to a depressurization operation (lower than or equal to 10 mmHg) to obtain a bonding material for mounting electric devices as an inventive example of the first invention (Examples 1-3). The blend ratio of each ingredient is shown in Table 1.

Epoxy resin: 1,6-hexanedioldiglycidyl ether type epoxy resin (available from Asahi Denka Kogyo Co. Ltd, Trade name: ACR epoxy);

Latent hardening agent: 2-methylimidazoleazine (Japan Epoxy Resin Co. Ltd., trade name: epicure M12AZ);

Inorganic thickening material: AEROSIL (Registered Trademark) #200 (manufactured by Nippon Aerosil Co., Ltd.)

Conductive particles: Silver powder having a mean diameter of about 6 micrometer (manufactured by Mitsui Mining & Smelting Co., Ltd.)

Reforming agent A: trimethylolpropane tristhiopropionate (liquid) which is a sulfur-containing compound.

As Comparative Examples, the same experiments with the ingredients and the conditions as in the above Examples except that the kinds and the blending amount of the reforming agents were changed as shown in Table 1 (Comparative Examples 1-5).

Reforming agent B: silane coupling agent; vinyltrimethoxysilane (manufactured by Dow Corning Toray Co., Ltd.)

Reforming agent C: Titanate-type coupling agent; Plainact KR TTS (manufactured by Ajinomoto Fine-Techno. Co., Ltd.)

TABLE 1

Compositions of the bonding materials (parts by weight)

| | epoxy resin | latent hardening agent | inorganic thickening agent | conductive particles | reforming agent A | B | C |
|---|---|---|---|---|---|---|---|
| Example 1 | 100 | 15 | 1 | 500 | 40 | — | — |
| Example 2 | 100 | 15 | 1 | 500 | 1 | — | — |
| Example 3 | 100 | 15 | 1 | 500 | 100 | — | — |
| Comparative Example 1 | 100 | 15 | 1 | 500 | — | — | — |
| Comparative Example 2 | 100 | 15 | 1 | 500 | — | 3 | — |
| Comparative Example 3 | 100 | 15 | 1 | 500 | — | — | 3 |
| Comparative Example 4 | 100 | 15 | 1 | 500 | 0.5 | — | — |
| Comparative Example 5 | 100 | 15 | 1 | 500 | 110 | — | — |

In order to evaluate the properties of the bonding materials obtained in Examples 1-3 and Comparative Examples 1-5, the hardening temperatures and Preservation period (days) are obtained as follows:

1) Hardening Temperature

Eight samples of unhardened bonding materials and eight glass-epoxy boards were provided. Each bonding material was directly printed on a surface of each glass-epoxy board, respectively, which surface was already coated with a copper plating. Each of the printed bonding material had a rectangular parallelepiped form having 1 mm length, 1 mm width and 0.1 mm height. Each of samples was heated for 10 minutes at 60 degree centigrade, 70 degree centigrade, 80 degree centigrade, 90 degree centigrade, 100 degree centigrade, 110 degree centigrade, 120 degree centigrade and 130 degree centigrade, respectively, followed by being naturally-cooled to a room temperature (about 25 degree centigrade). Alternatively, a transfer printing technique which provides the accuracy comparable with the above printing could be adopted instead of the printing method. Each of the obtained samples was settled in a Differential Thermal Analyzer (DTA) and heated at a uniform rate of heating (10 degree centigrade per minutes), thereby heat quantity Q1 which was used during the period from just after starting of heating at the predetermined temperature until the completely hardened state was measured, respectively.

Separately, one sample of unhardened bonding material was settled in the Differential Thermal Analyzer (DTA) and heated at a uniform rate of heating (10 degree centigrade per minutes), thereby heat quantity Q0 which was used during the period from the unhardened state until the completely hardened state was beforehand measured. Then, each hardening rate R (%) by heating at each of the predetermined temperature as mentioned in the above was calculated on each sample according to the formula (1):

[formula 1]

$$R = \frac{Q_0 - Q_1}{Q_0} \times 100(\%) \quad (1)$$

Among the temperature conditions which provide 90% or more of hardening rate (R), the lowest temperature was established as the hardening temperature. According to the inventor's extensive experience, it is known that a bonding material indicates an excellent reliability relating to mechanical and electrical bonding for a long period as far as it shows a hardening temperature or 90% or more.

2) Period of Stable Preservation

Just after the sample of the bonding material was prepared, the viscosity $\eta 0$ thereof was measured. Thereafter, the viscosity $\eta 1$ of the same sample was repeatedly measured while keeping the temperature of the sample at about 25 degree centigrade. An E type Viscometer was used to measure the viscosity. The period of days that the measured viscosity took to reach a condition showing $\eta 1 \geqq 2 \times \eta 0$ was assigned as the "Period of stable preservation." According to the inventor's extensive experience, it is known that a bonding material which shows 7 days or more of Period of stable preservation involves no practical problem.

The results of the above evaluation of the properties are set forth in the following Table 2:

TABLE 2

Evaluation of properties of the bonding materials

| | hardening temperature (° C.) | Period of stable preservation (days) |
|---|---|---|
| Example 1 | 70 | 20 |
| Example 2 | 80 | 28 |
| Example 3 | 70 | 8 |
| Comparative Example 1 | 120 | 24 |
| Comparative Example 2 | 120 | 23 |
| Comparative Example 3 | 130 | 22 |
| Comparative Example 4 | 120 | 24 |
| Comparative Example 5 | 60 | 2 |

As understood from Table 2, each bonding material in Examples 1-3 shows too low hardening temperature, and also practically suitable Period of stable preservation. On the other hand, each bonding material in Comparative Examples 1-4 shows higher hardening temperature rather than that of the bonding materials of Examples 1-3 and the bonding material in Comparative Example 5 did not show sufficient preservation stability.

2. Preparation of Circuit Board and Performance of Electric/Electronic Device Installing the Circuit Board Therein Using each of the bonding materials obtained from the above Examples 1-3 and Comparative Examples 1-3, a circuit board was prepared and the performance of the electric/electronic device equipped with the above circuit board was measured, respectively.

In order to grasp the maximum temperature of a board when the board is heated in a reflow oven, a board to which a temperature sensor being attached was passed through the reflow oven at each conditions corresponding to each of the hardening temperatures (Table 1) of the bonding materials of Examples 1-3 and Comparative Examples 1-3 for 10 minutes of heating period, thereby the temperature that the board was subjected to was measured over time. Each temperature profile of the maximum temperature obtained in the above measurement are shown in Table 3 as reflow peak temperature of each Example.

Then, using each bonding material of Examples 1-3 and Comparative Examples 1-3, the bonding material was applied to the surface of the electrode on a board by printing or transfer printing and then an electric component was arranged onto the circuit board so that the electrodes of the electric component were suitably aligned with and contacted with the bonding material on the board. Thereafter, each board was passed through a reflow oven which is set at each conditions corresponding to each of the hardening temperatures of the bonding materials of Examples 1-3 and Comparative Examples 1-3 for 10 minutes of heating period, thereby each of the electric components were mounted on the board to obtain a mounted circuit board, respectively. As the electric component, a connector (a molded component made of polyethylene) having an allowable temperature of 90 degree centigrade was used.

Using each circuit board, a compact disc player as the electric/electronic device was assembled, respectively. The above obtained electric/electronic device was tested whether or not it performs properly. The results of the above test are shown in Table 3.

TABLE 3

Heating conditions in the production of the circuit board and the performance of the obtained electric/electronic device

| | Reflow Peak Temperature (° C.) | performance of electric device |
|---|---|---|
| Example 1 | 75 | normally operated |
| Example 2 | 86 | normally operated |
| Example 3 | 70 | normally operated |
| Comparative Example 1 | 129 | not operated |
| Comparative Example 2 | 131 | not operated |
| Comparative Example 3 | 135 | not operated |

As understood from Table 3, each electric device equipped with a circuit board prepared using the bonding material in Examples 1-3 showed a reflow peak temperature lower than the allowable temperature of the electric device and could normally operate without causing thermal damage of the electric device. On the other hand, each electric device equipped with a circuit board prepared using the bonding material in Comparative Examples 1-3 showed a reflow peak temperature higher than the allowable temperature of the electric device and could not operate properly, which seemed to be due to causing thermal damage of the electric device.

Second Invention

Example 4

To 100 parts by weight of ethanol, 100 parts by weight of silver oxides and 1 parts by weight of 1,10-decanedithiol were added, to which ultrasonic wave (22.9 kHz, 100 W) was subjected for two hours to obtain silver nano-particles (having a mean diameter of about 8 nm) from silver oxides. Thus, a dispersion of the silver particles (also referred to as "silver nano-particles" in this example) was prepared. To the obtained dispersion, 100 parts by weight of another silver particles (having a mean diameter of about 5 μm) and 20 parts by weight of bisphenol F type epoxy resin (trade name "Epikote 871", manufactured by Japan Epoxy Resin Co. Ltd.) based on 100 parts by weight of the silver particles in the dispersion were mixed and the mixture was kneaded by a three-roll mixer to obtain a conductive paste.

Example 5

To 100 parts by weight of ethanol, 100 parts by weight of silver particles (having a mean diameter of about 10 μm) and 1 parts by weight of 1,10-decanedithiol were added to obtain a dispersion of silver particles. To the obtained dispersion, 100 parts by weight of another silver particles (having a mean diameter of about 5 μm) and 20 parts by weight of bisphenol F type epoxy resin (trade name "Epikote 871", manufactured by Japan Epoxy Resin Co. Ltd.) based on 100 parts by weight of the silver particles in the dispersion were mixed and the mixture was kneaded by a three-roll mixer to obtain a conductive paste.

Example 6

The procedure of Example 4 was repeated to obtain a conductive material except that 1,10-decanedithiol as the sulfur-containing compound having an end group of thiol group was replaced with 1,10-diaminodecane as the sulfur-containing compound having an end group of amino group.

Comparative Example 6

To 100 parts by weight of ethanol, 100 parts by weight of nickel particles (having a mean diameter of about 5 μm) and 1 parts by weight of 1,10-decanedithiol were added to obtain a dispersion of nickel particles. To the obtained dispersion, 10 parts by weight of bisphenol F type epoxy resin (trade name "Epikote 871", manufactured by Japan Epoxy Resin Co. Ltd.) based on 100 parts by weight of the nickel particles in the dispersion were mixed and the mixture was kneaded by a three-roll mixer to obtain a conductive paste.

In order to evaluate the properties of the conductive materials obtained in Examples 4-6 and Comparative Examples 6, the preservation stability and the specific resistance were measured according to the following methods.

Preservation Stability (or life): A conductive paste is preserved in a constant-temperature bath under an air atmosphere which is set to keep 25 degree centigrade and the period of time until the conductive paste looses flowability, in particular until the viscosity of the conductive paste exceeds about 50 Pa·s was measured for a month.

Specific Resistance: A conductive paste was coated on the surface of a PET (polyethylene terephthalate) film at a region of 3 mm width and 150 mm length with 50 μm thickness, which film was irradiated with a ultraviolet ray at an accumulated amount of light of 5000 mJ, followed by being heated at a predetermined temperature for 30 hours to obtain a hardened product. The volume resistivity of thus obtained hardened product was measured according to JIS (Japanese Institute Standard) K6911, and from the result the specific resistance was calculated. The results are shown in table 4.

TABLE 4

|  | Example 4 | Example 5 | Example 6 | Comparative Example 6 |
|---|---|---|---|---|
| Preservation Stability | over 1 month | over 1 month | over 1 month | 2 hours |
| Specific Resistance (Ω) (heating temperature) | $1 \times 10^{-5}$ (120° C.) | $2 \times 10^{-4}$ (120° C.) | $1 \times 10^{-5}$ (200° C.) | $5 \times 10^{-3}$ (120° C.) |

The conductive paste of Examples 4-6 did not lose flowability within the period of the of the preservation reliability test (one month) and maintained a high level preservation reliability (Table 4). The reason seems to be that the sulfur-containing compound coordinates at the thiol end group or the amino end group thereof with the surface of the silver particles to form a metal coordination compound, thereby the thiol group or the amino group being capped, so that they did not react with the epoxy resin to cause the hardening reaction.

In the conductive paste of Examples 4-6, after the preservation test finished, it was visually confirmed that the silver particles were stably dispersed and the agglomeration of the silver particles was not observed. In particular, although the conductive paste of Example 4 contained nano-sized particles which tend to easily agglomerate, it seems that such particles could stably exist in the resin by forming a metal coordination compound.

Further, the conductive paste of Examples 4-6 showed sufficiently satisfactory low resistance as the conductive material in the specific resistance test (Table 4). The reason seems to be that the sulfur-containing compounds having the thiol group or the amino group dissociated from the silver particles by irradiation of ultraviolet ray and the following heating, the dissociated sulfur-containing compound performed as the hardening agent to harden the resin, so that silver particles came to contact one another or got closer to each other after the resin volumetrically shrinked and hardened.

In particular, the conductive paste of Example 4 showed a much lower resistance rather than the conductive paste of Example 5. The reason seems to be that the silver nano-particles sintered at a low temperature by the heating in the specific resistance test.

Meanwhile, apart from the conductive paste of Examples 4 and 5, the specific resistance of the conductive paste of Example 6 could not be measured at the heating temperature of 120 degree centigrade and showed no conductivity. The reason seems to be that the sulfur-containing compound having the amino end group did not dissociate from the silver particle and could not perform as the hardening group for the epoxy resin. When the heating temperature was increased to 200 degree centigrade as shown in Table 4, it was confirmed that the conductive paste showed a sufficiently low resistance.

On the other hand, as to the conductive paste of Comparative Example 4, the specific resistance thereof could be measured at the heating temperature of about 120 degree centigrade. Such resistance value was allowable level for the conductive material. The reason seems to be that the sulfur-containing compounds could perform as the hardening agent for the epoxy resin by the irradiation of ultraviolet ray and the heating to harden the resin, so that nickel particles came to contact one another or got closer to each other after the resin volumetrically shrinked and hardened.

However, the period of stable preservation of the conductive paste of Comparative Example 4 was too short and was merely two hours. The reason seems to be that the thiol end group of sulfur-containing compound existed freely without being coordinated with the surface of the nickel particles, so that the sulfur-containing compound reacted with the epoxy resin to cause the hardening the resin.

Third Invention

As the inventive examples and the Comparative Examples of the conductive paste of the present third invention, various kinds of conductive paste were prepared by mixing the constituents shown in Table 5 with the ratio shown in Table 6. In these inventive examples and the Comparative Examples, common materials are used as the resin and the conductive fillers. Bisphenol A type epoxy resin was used as the resin, and silver particles having a mean diameter from 2-15 μm (Trade Name "silcoat", manufactured by Fukuda Metal Foil & Powder Co., Ltd) was used as the conductive particles. As the hardening agent, an imidazole type hardener (Trade Name "Curezole (registered trademark)", Shikoku Chemicals, Co. Ltd.) or a polymercaptan type hardener (mercaptopropionic acid) was used. In the inventive example, limonen or ethyl-vanillin was used as the fragrance, on the other hand, in the Comparative Example, no fragrance was used.

TABLE 5

|  | Constituent | | | |
|---|---|---|---|---|
| number | resin | hardening agent | conductive filler | fragrance |
| Example 7 | bisphenol A type epoxy resin | imidazole type hardener | silver particle | limonen |
| Example 8 | bisphenol A type epoxy resin | polymercaptan type hardener | silver particle | ethyl-vanillin |
| Example 9 | bisphenol A type epoxy resin | polymercaptan type hardener | silver particle | cinnamic acid |
| Comparative Example 7 | bisphenol A type epoxy resin | imidazole type hardener | silver particle | — |
| Comparative Example 8 | bisphenol A type epoxy resin | polymercaptan type hardener | silver particle | — |

TABLE 6

| number | Constituent | | | |
|---|---|---|---|---|
| | resin | hardening agent | conductive filler | fragrance |
| Example 7-9 | 100 | 15 | 500 | 10 |
| Comparative Example 7-9 | 100 | 15 | 500 | 0 |

Relating to each of Examples 7 and 8 as well as Comparative Examples 7 and 8, a test whether a human having normal olfactory sense could feel unpleasant stench when he brings his nose to the conductive paste by one hundred people of experimental subjects. Herein, an index of feeling unpleasant stench is defined by the formula:

[formula 2]

$$\text{(index of feeling unpleasant stench)} = \frac{\begin{pmatrix} \text{number of experimental} \\ \text{subjects who} \\ \text{felt unpleasant} \end{pmatrix}}{\begin{pmatrix} \text{sum of experimental} \\ \text{subjects} \end{pmatrix}} \quad (2)$$

The results are shown in Table 7.

TABLE 7

| number | index of feeling unpleasant stench (—) |
|---|---|
| Example 7 | 0.2 |
| Comparative Example 7 | 0.2 |
| Example 8 | 0.4 |
| Comparative Example 8 | 0.9 |

In each Comparative Examples 7 and 8, the same procedure was repeated as the inventive Examples 7 and 8, respectively, except that the fragrance was not added thereto. With reference to Table 7, when inventive Example 7 is compared with Comparative Example 7, the index of feeling unpleasant stench was lower in inventive Example 7 rather than Comparative Example 7, and also the index of feeling unpleasant stench was lower in inventive Example 8 rather than Comparative Example 8. Accordingly, it was confirmed that inventive Examples can substantially reduce the unpleasant stench rather than Comparative Examples which do not use fragrances.

Volume resistivity of the hardened product obtained from each of Example 9 and Comparative Example 8 was measured. The conductive paste of each Example was hardened by heating at a temperature of 100 degree centigrade for 10 minutes and then the Volume resistivity of each sample was measured according to Japanese Industrial Standard (JIS) K 6911. For reference, the Volume resistivity of Comparative Example 7 was measured. The results are shown in Table 8.

TABLE 8

| number | Volume resistivity (Ω cm) |
|---|---|
| Example 9 | $3 \times 10^{-4}$ |
| Comparative Example 8 | $5 \times 10^{-3}$ |
| Comparative Example 8 | $2 \times 10^{-4}$ |

In Comparative Example 8, the same procedure was repeated as the inventive Example 9 except that the fragrance was not added. With reference to Table 8, the volume resistivity of inventive Example 9 was compared with that of Comparative Example 8. The volume resistivity of inventive Example 9 was lower than that of Comparative Example 8, so that it was confirmed that inventive Example 9 showed suitable conductivity. In Example 9, cinnamic acid was used as the fragrance, which has a reducing ability. Thus, it was conceived that sulfurization of the silver particles, which were used as the conductive filler, was efficiently prevented by cinnamic acid although a compound having thiol group (—SH) was used as the hardening agent in Example 9.

Also with reference to Table 8, in case where a fragrance is not used, Comparative Example 8 which uses a compound having a thiol group as a hardening agent showed higher volume resistivity rather than Comparative Example 7 which uses a compound without a thiol group as a hardening agent. It was conceived that a thiol group sulfurized the metal in the conductive filler to form a sulfide when the conductive paste did not contain a compound having a reducing ability.

An easiness of inspecting completion of the hardening in the method of producing electric components mounted products by mounting electric components on circuit boards with the hardened product obtained from the conductive pastes was measured in Example 8 and Comparative Example 8. In Example 8, the hardening of the conductive paste did not completed while the perfume of the conductive paste is present. Thus, it can be conceived that an operator can determine that the hardening of the conductive paste was completed when the perfume of the conductive paste comes to absent, so that evaluated with an open circle (○). To the contrary, the method to determine completion of the hardening is limited in the Comparative Example 8. Such method is either to inspect visually the change of the color tone of the resin, or to measure the connection strength or connection resistance. It is difficult to determine the color tone due to the influence of the color of the conductive filler in the former case, and any measuring apparatus is necessary in the latter case. Accordingly, Comparative Example 8 was difficult as to inspecting completion of the hardening rather than Example 8, so that evaluated with a triangle (Δ).

Then, an applicability ratio of the conductive paste among electric devices was measured. Here, the applicability ratio of the conductive paste among electric devices is defined by the formula (3):

[formula 3]

$$\text{(applicabilty ratio)} = \frac{\text{(number of allowable electric device)}}{\text{(sum of electricdevice)}} \times 100 \quad (3)$$

Note that the denominator "sum of electric device" means and the numerator "number of allowable electric device" in the above Formula 3 are made on the basis of inventor's broad vision. The results are shown in table 9.

TABLE 9

| number | easiness of inspection | applicability ratio (%) |
|---|---|---|
| Example 8 | ○ | 60 |
| Comparative Example 8 | Δ | 20 |

As shown in Table 9, inspection was easier in Example 8 rather than in Comparative Example 8 and the applicability ratio of the conductive paste among electric devices in Example 8 was significantly improved rather than in Comparative Example 8.

INDUSTRIAL APPLICABILITY

The circuit boards prepared using any conductive paste of first to third invention of the present application can be used for any of arbitrary electric/electronic devices. The examples of such electric/electronic devices are as shown below:
- Portable electronic devices such as video-camera, portable CD, portable MD, portable DVD, mobile phone and laptop computer;
- Typically stationary settled electronic devices such as stereo set, desk-top type computer, video telephone, DVD player, CD player, DVD recorder, CD recorder and television set;
- Home appliance electronic devices such as rice cooking device, microwave oven, refrigerator, cleaner, washing machine, air conditioner, lighting apparatus, intercom, security camera, monitoring camera, gas leakage detector and the toilet seat with the washing functions;
- Electronic devices for vehicles, for example for automobile and two-wheeled motor vehicle, such as car stereo, car navigation system, car air-conditioner, car sensor, engine controller, loading camera, automatic brake safe control system (ABS) and headlight.

The conductive bonding materials in the first and second inventions are applicable to various fields such as for forming a circuit wiring pattern on a circuit board; the materials for forming electric connections among multilayer circuit boards; and the bonding materials for bonding materials for forming mounted electric components in the technical field of forming electric/electronic circuit The conductive bonding materials in the third invention is applicable to various fields such as portable electronic devices, devices for processing or preservation of foods, and home appliance electronic devices as the electric-component mounted bodies.

The invention claimed is:

1. A method of preparing a circuit board having a circuit-wiring pattern on the surface of said board comprising:
   subjecting a conductive paste comprising metallic particles, a sulfur-containing compound and a resin wherein the sulfur-containing compound coordinates at the end group thereof with the surface of the metallic particles, to any of ultraviolet ray irradiation, electron ray irradiation and heating operation, thereby dissociating the sulfur-containing compound from the surface of the metallic particles; then
   applying the conductive paste to a circuit board in a pattern corresponding to the circuit wiring pattern; and
   causing the dissociated sulfur-containing compound to operate as a hardening agent, thereby hardening the resin.

2. The method according to claim 1, wherein the end group of the sulfur-containing compound in the conductive paste is a thiol group.

3. The method according to claim 1, wherein the resin in the conductive paste is epoxy resin.

4. The method according to claim 1, wherein the metallic particles in the conductive paste comprise metallic materials selected from the group consisting of gold, silver and copper.

5. The method according to claim 1, wherein the metallic particles in the conductive paste have a mean diameter between 1 nm and 100 micrometer.

6. The method according to claim 1, wherein the conductive paste contains two or more kinds of metallic particles, and the sulfur-containing compound coordinates at the end group thereof with the surface of at least one kind of metallic particles.

7. A method of preparing a multilayered circuit board, wherein a plurality of wiring layers are superposed on each other and at least two wiring layers are electrically connected to each other through one or more holes penetrating the circuit board, comprising:
   subjecting a conductive paste comprising metallic particles, a sulfur-containing compound and a resin wherein the sulfur-containing compound coordinates at the end group thereof with the surface of the metallic particles, to any of ultraviolet ray irradiation, electron ray irradiation and heating operation, thereby dissociating the sulfur-containing compound from the surface of the metallic particles; then
   filling the conductive paste in one or more holes of the circuit board; and
   causing the dissociated sulfur-containing compound to operate as a hardening agent, thereby hardening the resin.

8. The method according to claim 7, wherein the end group of the sulfur-containing compound in the conductive paste is a thiol group.

9. The method according to claim 7, wherein the resin in the conductive paste is epoxy resin.

10. The method according to claim 7, wherein the metallic particles in the conductive paste comprise metallic materials selected from the group consisting of gold, silver and copper.

11. The method according to claim 7, wherein the metallic particles in the conductive paste have a mean diameter between 1 nm and 100 micrometer.

12. The method according to claim 7, wherein the conductive paste contains two or more kinds of metallic particles, and the sulfur-containing compound coordinates at the end group thereof with the surface of at least one kind of metallic particles.

13. A method of preparing an electric-component mounted body having one or more circuit boards to which one or more electric components are mounted, comprising:
   applying a conductive paste comprising metallic particles, a sulfur-containing compound and a resin wherein the sulfur-containing compound coordinates at the end group thereof with the surface of the metallic particles, to a circuit board in a predetermined pattern;
   subjecting the conductive paste to any of ultraviolet ray irradiation, electron ray irradiation and heating operation, thereby dissociating the sulfur-containing compound from the surface of the metallic particles; then
   arranging one or more electric components on the circuit board so that the electric components contact with the conductive paste; and
   causing the dissociated sulfur-containing compound to operate as a hardening agent, thereby hardening the resin.

14. The method according to claim 13, wherein the step of subjecting the conductive paste to any of ultraviolet ray irradiation, electron ray irradiation and heating operation is followed by the step of applying the conductive paste to the circuit board.

15. The method according to claim 13, wherein the end group of the sulfur-containing compound in the conductive paste is a thiol group.

16. The method according to claim 13, wherein the resin in the conductive paste is epoxy resin.

17. The method according to claim 13, wherein the metallic particles in the conductive paste comprise metallic materials selected from the group consisting of gold, silver and copper.

18. The method according to claim 13, wherein the metallic particles in the conductive paste have a mean diameter between 1 nm and 100 micrometer.

19. The method according to claim 13, wherein the conductive paste contains two or more kinds of metallic particles, and the sulfur-containing compound coordinates at the end group thereof with the surface of at least one kind of metallic particles.

* * * * *